US009525603B2

(12) United States Patent
Karpov et al.

(10) Patent No.: US 9,525,603 B2
(45) Date of Patent: Dec. 20, 2016

(54) FIELD SELECTION GRAPHICAL USER INTERFACE

(71) Applicant: Teledyne LeCroy, Inc., Thousand Oaks, CA (US)

(72) Inventors: Dmitry Karpov, San Jose, CA (US); Dmitry Gordeychev, Castro Valley, CA (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 209 days.

(21) Appl. No.: 13/719,994

(22) Filed: Dec. 19, 2012

(65) Prior Publication Data

US 2014/0173512 A1    Jun. 19, 2014

(51) Int. Cl.
  *G06F 3/0482*   (2013.01)
  *H04L 12/26*    (2006.01)
  *G06F 9/44*     (2006.01)
  *G06F 17/50*    (2006.01)

(52) U.S. Cl.
  CPC ......... *H04L 43/045* (2013.01); *G06F 3/0482* (2013.01); *G06F 9/4443* (2013.01); *G06F 17/50* (2013.01); *H04L 43/18* (2013.01)

(58) Field of Classification Search
  CPC .................................................. G06F 3/0482
  USPC ........................................................ 715/810
  See application file for complete search history.

(56) References Cited

U.S. PATENT DOCUMENTS 5,796,721 A * 8/1998 Gretta, Jr. ......... H04L 43/028
                                                      370/245
5,850,523 A * 12/1998 Gretta, Jr. ......... H04L 12/40013
                                                      709/224
5,933,602 A *  8/1999 Grover ............... H04L 43/028
                                                      709/224
6,463,320 B1 * 10/2002 Xue ....................... A61B 5/00
                                                      600/523
6,639,607 B1 * 10/2003 Ferguson ............... G06F 11/25
                                                      714/E11.155
6,757,727 B1 *  6/2004 Ivory .................... H04L 41/02
                                                      370/242

(Continued)

OTHER PUBLICATIONS

Screenshots of Microsoft Access 2010 version 14.0.6024.10000, Sep. 2, 2011.*

(Continued)

*Primary Examiner* — Reza Nabi
*Assistant Examiner* — Daniel Rodriguez

(57) ABSTRACT

A field selection graphical user interface (GUI) for use with a protocol analyzer. The GUI allows selecting a source presented by the GUI, selecting a field from a plurality of fields presented by the GUI associated with the selected source, defining one or more preconditions associated with the selected field from a plurality of preconditions presented by the GUI relevant to the selected field, and calculating a field layout in accordance with the selected field and defined one or more preconditions. The GUI further allows selecting a second field from the plurality of fields presented by the GUI associated with the selected source, defining one or more preconditions associated with the selected second field from a plurality of preconditions presented by the GUI relevant to the selected second field, and calculating a field layout in accordance with the selected field and the second field.

18 Claims, 21 Drawing Sheets

(56) References Cited

U.S. PATENT DOCUMENTS

| | | | |
|---|---|---|---|
| 6,850,852 B1* | 2/2005 | Ferguson | G06F 11/25 702/67 |
| 6,907,365 B2* | 6/2005 | Salant | G01R 13/0227 702/68 |
| 7,516,114 B2* | 4/2009 | Dieberger | G06F 11/324 |
| 8,224,810 B2* | 7/2012 | Dettinger | G06F 17/30398 707/718 |
| 8,521,564 B1* | 8/2013 | Ciechanowski | 705/3 |
| 8,677,505 B2* | 3/2014 | Redlich | G06F 21/577 713/166 |
| 2001/0039579 A1* | 11/2001 | Trcka et al. | 709/224 |
| 2003/0074269 A1* | 4/2003 | Viswanath | G06Q 30/06 705/26.82 |
| 2003/0131098 A1* | 7/2003 | Huntington | H04L 12/2602 709/224 |
| 2003/0135525 A1* | 7/2003 | Huntington et al. | 707/501.1 |
| 2007/0027845 A1* | 2/2007 | Dettinger | G06F 17/3053 |
| 2007/0206496 A1* | 9/2007 | Roy | G06F 13/4059 370/229 |
| 2007/0220485 A1* | 9/2007 | Lee | G06F 8/38 717/110 |
| 2008/0004035 A1* | 1/2008 | Atkins et al. | 455/454 |
| 2011/0225143 A1* | 9/2011 | Khosravy | G06F 17/30471 707/713 |
| 2012/0084669 A1* | 4/2012 | Flint | G06Q 10/10 715/753 |
| 2013/0064096 A1* | 3/2013 | Degioanni | H04L 67/1097 370/241 |
| 2013/0125006 A1* | 5/2013 | Rule | H04L 41/22 715/738 |
| 2013/0132425 A1* | 5/2013 | Chung | G06F 17/30389 707/769 |
| 2013/0179855 A1* | 7/2013 | Elliott | 716/139 |
| 2013/0227689 A1* | 8/2013 | Pietrowicz | G01R 1/20 726/23 |
| 2014/0028729 A1* | 1/2014 | Abdukalykov | G06Q 10/109 345/661 |

OTHER PUBLICATIONS

Tap Systems, "STX—131 Protocol analyser, ONE-Port SATA/SAS Affordable Protocol Analysis System", Jun. 28, 2012, http://www.tapsystemsuk.com/protocol_analysis_stx131.html.*

* cited by examiner

FIELD SELECTION GRAPHICAL USER INTERFACE

BACKGROUND

This application relates to test systems intended for protocol analysis, and to a graphical user interface allowing for the building of aggregate fields that present complex combinations of fields and subfields from different sources.

Some areas of protocol analysis require building and using special aggregate fields that may present complex combinations of fields and subfields from different data sources. Such aggregate fields can be used to present analyzed data in different views that simplify the data, and provide better user perception of the analyzed data. One of these views may comprise a Wave Form View, which may present data as a set of wave form lines. Furthermore, one or more fields that are part of one or more of the above-noted aggregate fields may be conditional; they exist and are to be presented in a particular field layout only if one or more preconditions are met. These preconditions may in themselves comprise one or more simple field definition (such as "field X equals value Y"), or may comprise more complex Boolean or other logic, perhaps combining multiple logic patterns.

Traditionally, the ability to define these aggregate fields in a protocol analyzer has been difficult.

SUMMARY

The inventors of the present invention have recognized that in order to build such aggregate fields, as described above, it is desirable to provide a specialized graphical user interface (GUI) providing an easy and convenient way to select one or more fields and/or one r more subfields from one or more multiple sources, define one or more necessary (or preferred) preconditions, and provide a plurality of different combination options for preferably specifying how one or more selected fields and/or subfields should be combined in order to build a desired resulting aggregate fields.

While field selection GUIs have been presented in various different Wave Form View applications, in particular these solutions do not allow for the designation of one or more of the noted preconditions for the one or more selected fields. These and other applications allow for field selections from field layouts and may provide field combination options, but they fail to provide to a user field selection options along with precondition selection and definition in a simple to use, single GUI. Typically, preconditions and the like may be set in one or more filtering GUI presentations, separated from any field selection ability, thus reducing flexibility of the system and making overall field definition in a protocol analyzer inconvenient for the user.

This application is therefore directed to a unique GUI allowing a user to select one or more multiple fields from one or more multi field layouts (such as definitions of different types of data packets that may be used by different transport or other data transmission protocols), define and set up one or more field preconditions, and preferably all of these selections into an aggregate or combined field. Some of these fields may be defined as conditional in that they may only be provided in the multi field layout for selection if one or more conditions are met, such as if some other field first contains some other predefined value. The meeting of such preconditions preferably will allow for the presentation of one or more of such conditional fields in the multi field layout. Thus, one or more preconditions may be set in accordance with one or more of such fields to present the conditions in accordance with which it may be available or selection. The inventive GUI presented in accordance with one or more embodiments of the present invention efficiently combines both specifying field preconditions and field selection in one convenient GUI.

Therefore, it would be beneficial to provide a system and apparatus that provides a single GUI for setting preconditions and selecting fields to be part of a test protocol in accordance with a protocol analyzer.

Still other objects and advantages of the invention will be apparent from the specification and the drawings.

BRIEF DESCRIPTION OF DRAWINGS

For a more complete understanding of the invention, reference is made to the following description and accompanying drawings, in which.

DETAILED DESCRIPTION

A detailed description of illustrative embodiments will now be provided, making reference to the figures and providing details of the information flow and presentation to a user. Like reference numbers and designations in the various figures indicate like elements.

An inventive GUI is presented in accordance with one or more embodiments of the invention, and in particular is designed to allow for the following:
1) Select a "static field" to create a Wave Form View line from one source. "Static field" has a fixed location and length in a packet and don't depend on any other fields.
2) Select a "dynamic field" to create a Wave Form View line from one source. "Dynamic field" can have different locations (and even lengths) in a packet and depends on other field values. (For example, AET "MSRADDR" field is present only if "BaseType" field has value "MSR")
3) Select multiple fields from different sources, treat them as a one virtual "multi-source field" and create a Wave Form View line for it.
4) Select subfields of some field and show them as separate Wave Form View lines.
5) Provide flexibility to specify some conditions and different combination options when selecting fields—i.e. show in a Wave Form View line only fields that match some search criteria, show the same field for 2 different sources (like Core0_Thread0 and Core0_Thread1 in AET) in different Wave Form View lines.

Figure 1:
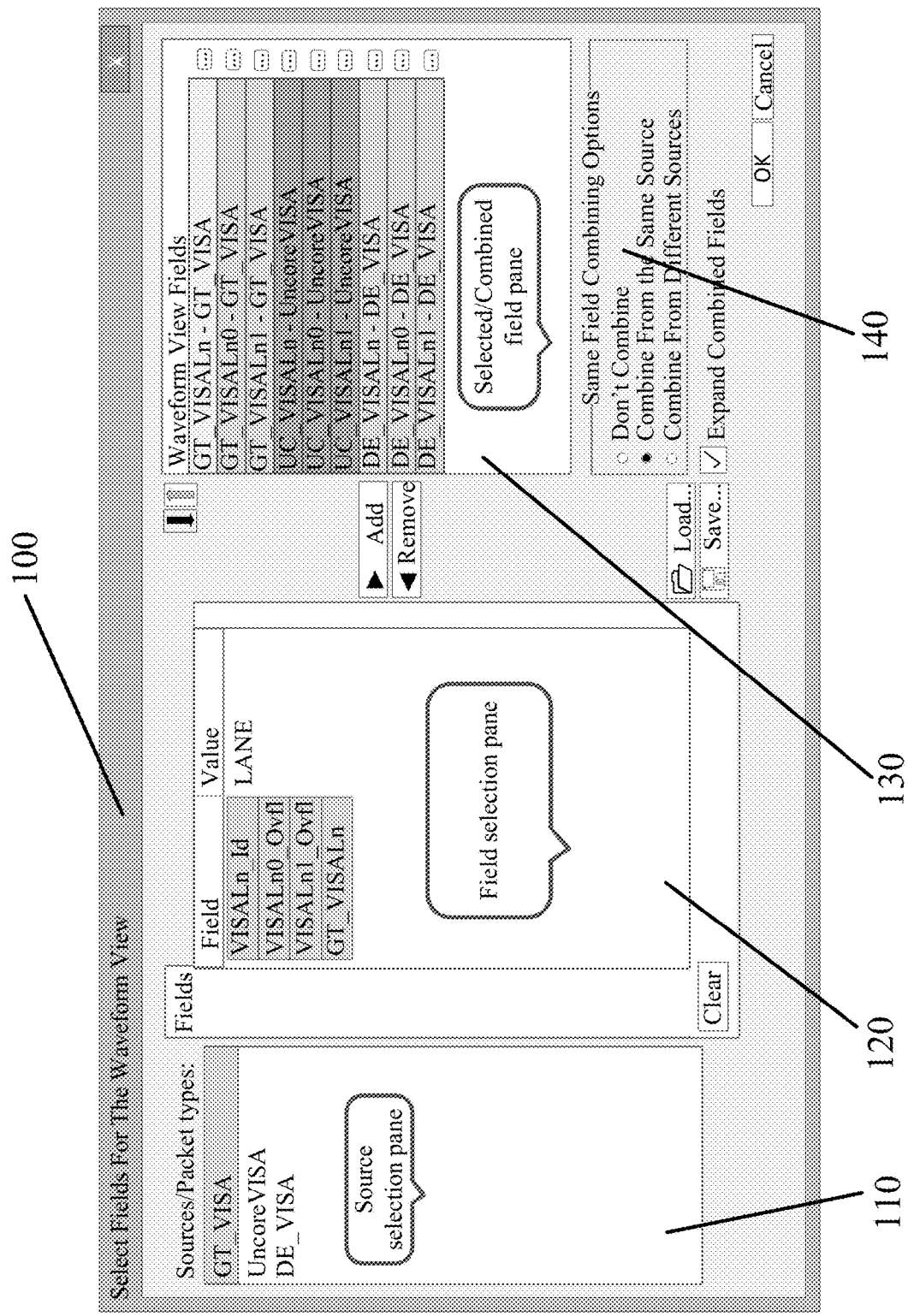
FIG. 1 is a graphical display depicting a field selection dialog window in accordance with an embodiment of the invention.

FIG. 1 depicts a preferred embodiment of the invention. As is shown in FIG. 1, a field selecting GUI 100 is presented to a user. The GUI is preferably arranged in a manner similar to that of a find/filter dialog. As is shown in FIG. 1, a source selection pane 110 allows for the selection of one or more sources of data for analysis. A field selection pane allows for selection of a particular field for analysis. In a preferred embodiment, field selection pane 120 is dependent upon source selection pane 110; upon selection of a particular source, only relevant fields are preferably displayed for selection. Of course, all fields may be displayed to the user at all times. Also shown in accordance with GUI 100 is a selected/combined field pane 130 that depicts various selected source and field combinations. Thus, the user is able to build a library of the various desired source and field combinations. Also presented in pane 130 as a set of radio buttons 140 allowing the user to select among one or more methods for combining the selected/combined fields, and in particular whether to combine those from different sources.

Figure 2:
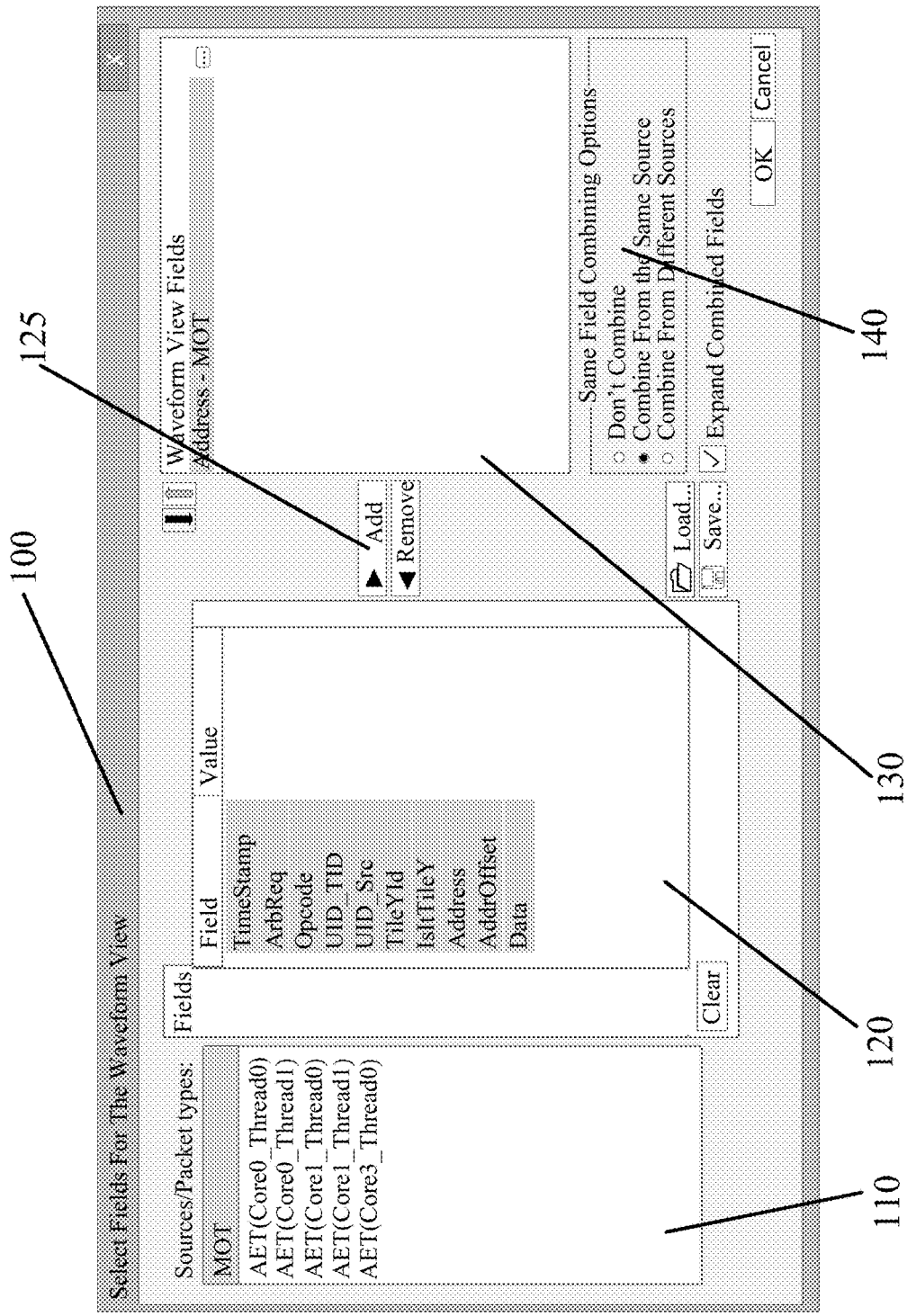
FIG. 2 is a graphical display depicting selection of a static field from one source in accordance with an embodiment of the invention.

In accordance with GUI 100, and as is shown in FIG. 2, a preferred set of steps for selecting a static field (a field that does not depend on any other field) may comprise the following steps.
1. Select the source in Source selection pane 110.
2. Select the field in field selection pane 120.
3. Click "Add" button 125 (or double-click the field in the Field selection pane).
4. The field selection will appear in the Selected/Combine Field pane 130.

Figure 3:
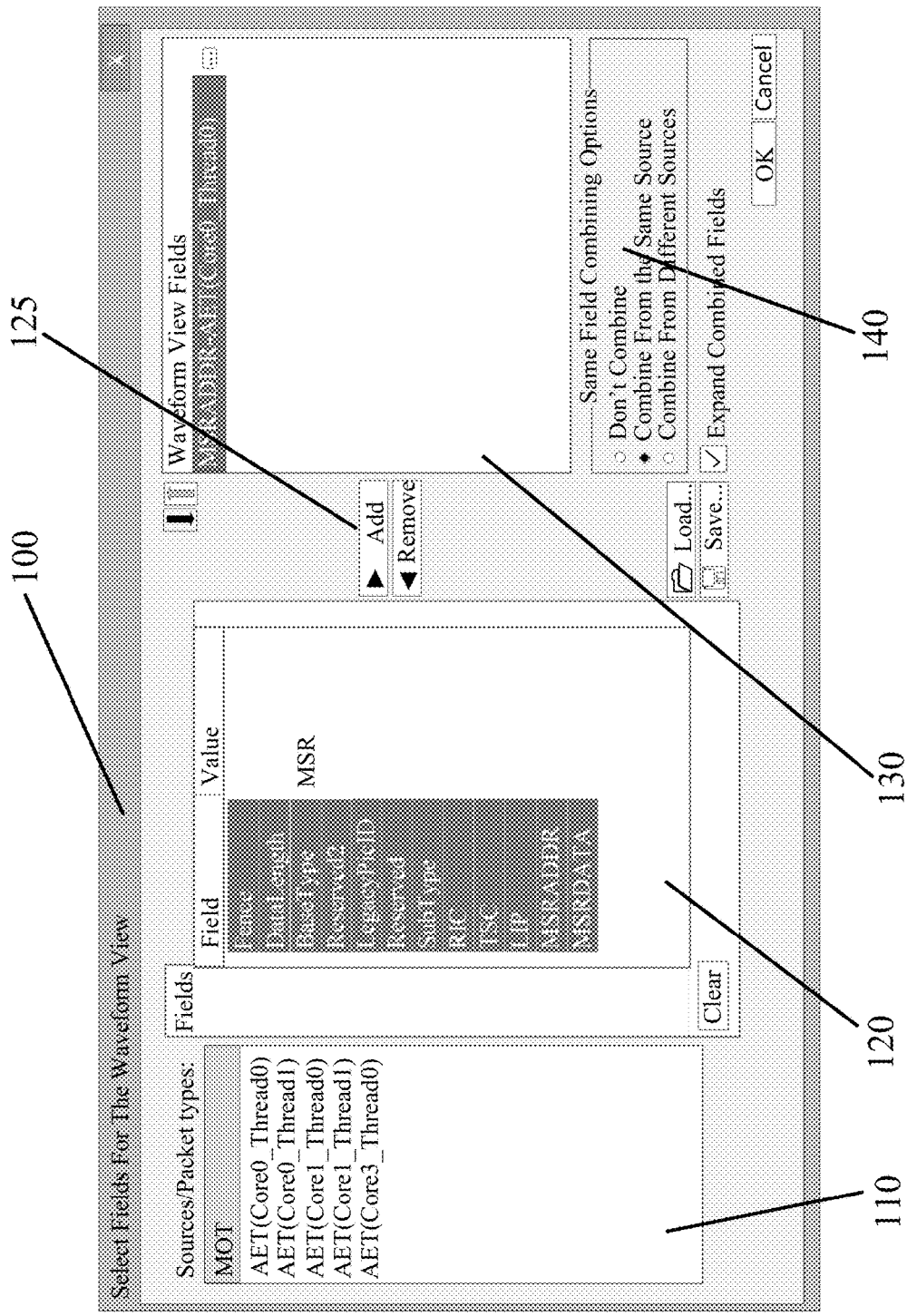
FIG. 3 is a graphical display depicting selection of a conditional field in accordance with an embodiment of the invention.

Referring next to FIG. 3, use of the inventive GUI for selection of a dynamic or conditional field from a single source is shown. The following description of selection of preconditions may be applied to fields that require such preconditions, or may alternatively be applied to one or more fields that may not require such preconditions, but such preconditions may be employed to reduce a data set or the like. In this particular embodiment, the field MSRADDR is dependent upon the "Base Type=MSR. These steps may comprise the following.
1. Select a source in source selection pane 110
2. Select and set one or more values of the fields upon which "conditional" field depends on in field selection pane 120, as shown in FIG. 3.
3. Subsequently select the conditional field in the Field selection pane 120.
4. Click Add button 125 (or double-click the field in the Field selection pane).
5. The field selection will appear in the Selected/Combine Field pane 130.

Figure 4:
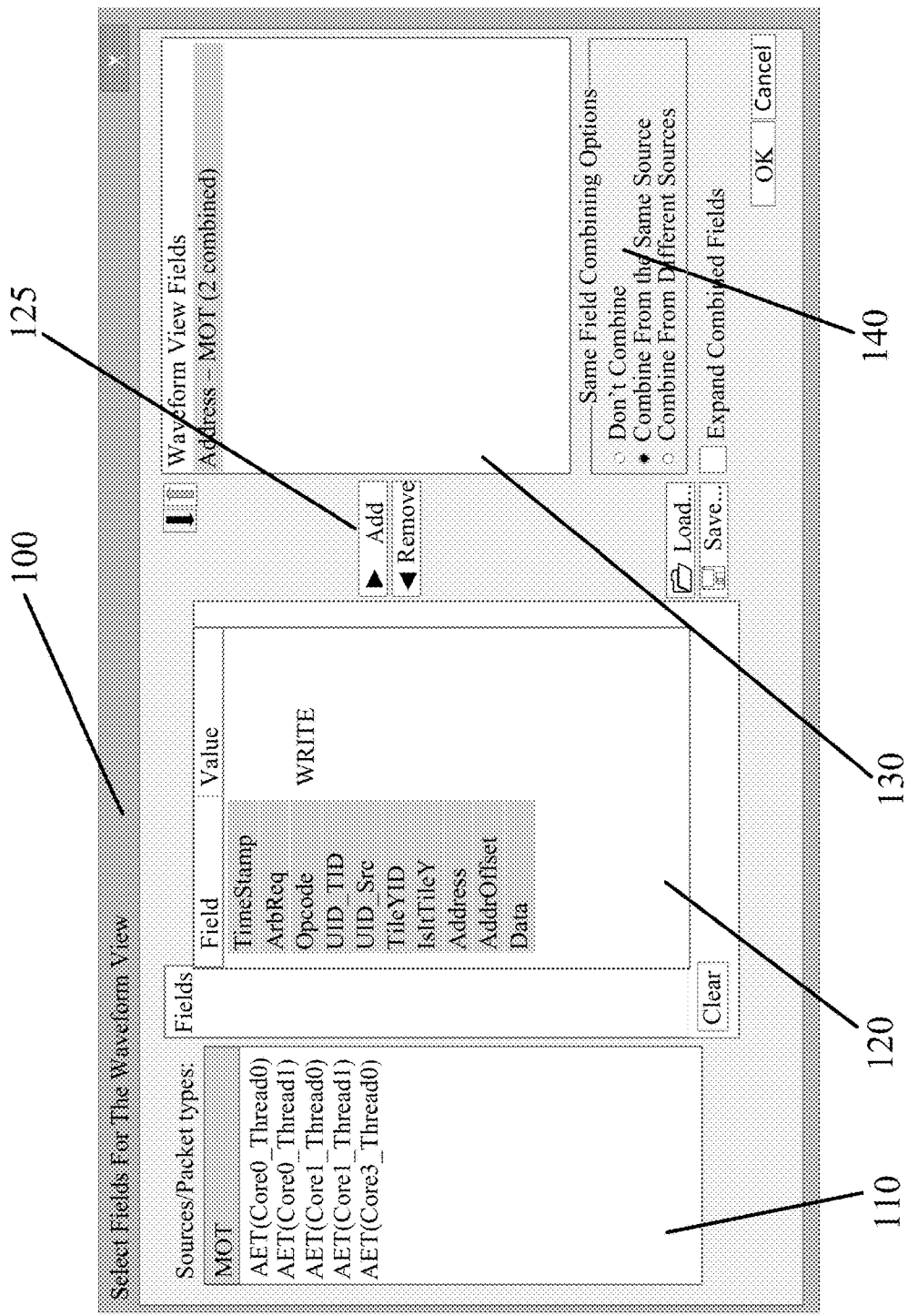
FIG. 4 is a graphical display depicting the results of adding a field in accordance with an embodiment of the invention.

Referring next to FIG. 4, use of the inventive GUI for selection of a field from a single source matching some predefined filter condition is shown. In this particular embodiment, if the user wants to select a field that matches some filtering criteria consisting of several pre-conditions (for example: select MOT "Address" if Opcode=WRITE or Opcode=READ) then the steps the user may take may comprise the following.
1. Select a source in source selection pane 110.
2. Select the "Combine From the Same Source" field combination option using the appropriate radio button 140.
3. Select and set values of the fields which define the first pre-condition of the conditional field in field selection pane 120 (as shown in FIG. 4), then subsequently select the conditional field in field selection pane 120 (not shown in FIG. 4) and click add button 125 (or double-click the field in the Field selection pane).
4. Repeat step 3 for the second pre-condition.
5. Repeat step 3 for all the other pre-conditions.
6. The field selections will appear in the Selected/Combine Field pane 130. Note that the "expand combined fields radio button is section 140 is not selected, and thus, because there are two preconditions set (for Address—MOT in this example) there is an indication of two combined preconditions associated with this field. If the 'expand combined fields" radio button is selected, the result is as shown in FIG. 5, in which each precondition is separately shown in Selected/Combine Field pane 130.

Figure 5:
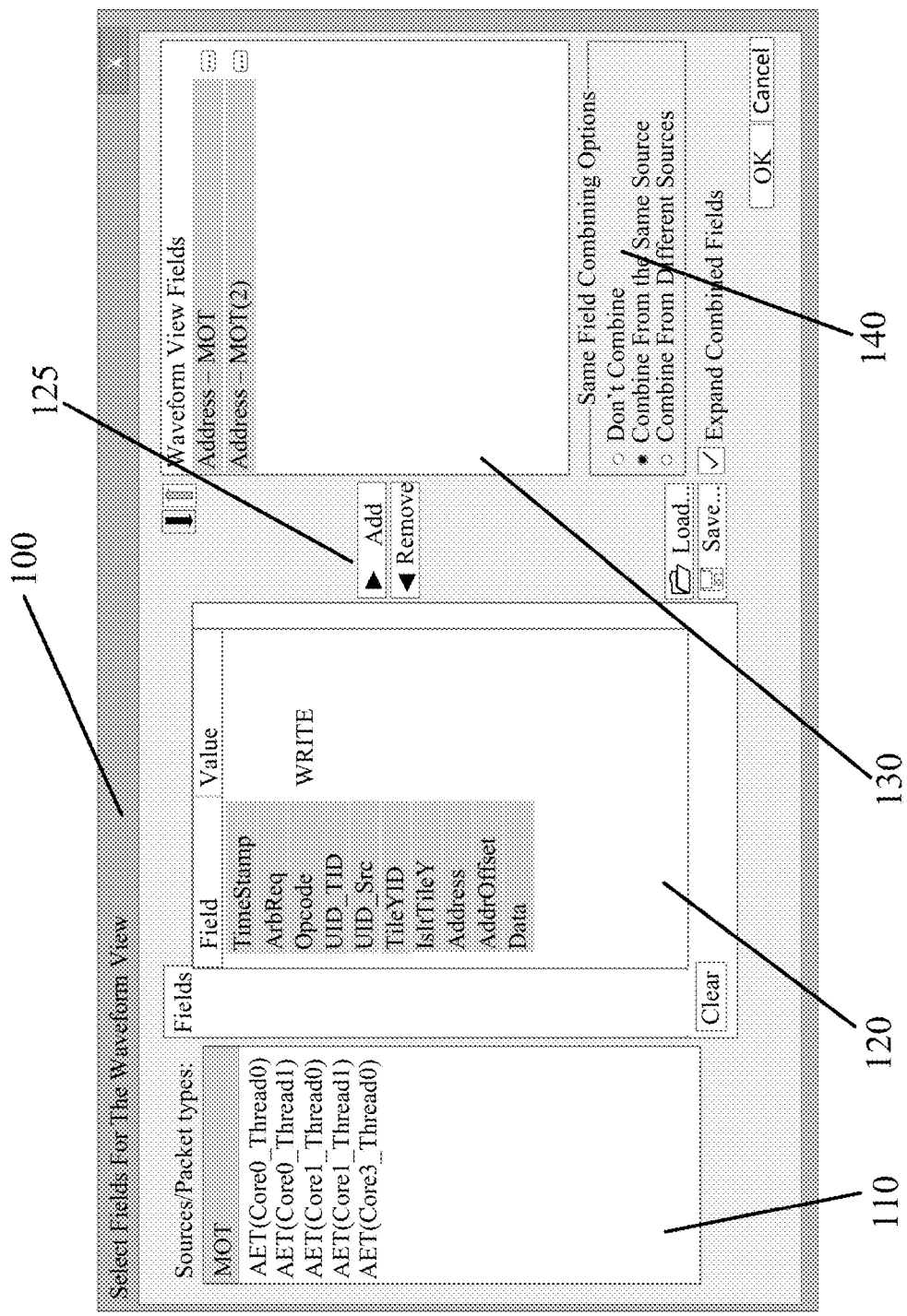
FIG. 5 is a graphical display depicting the results of adding a field showing expanded combined fields in accordance with an embodiment of the invention.

In case of the depicted MOT "Address" example in FIGS. 4 and 5, the following steps and results may be performed.
1. Select MOT in the Source selection pane 110.
2. Set Opcode field to WRITE in pane 120.
3. Select and add "Address" field in pane 120 using add button 125.
4. Set Opcode field to READ in pane 120.

5. Select and add "Address" field again in pane 120 using add button 125.

Figure 6:
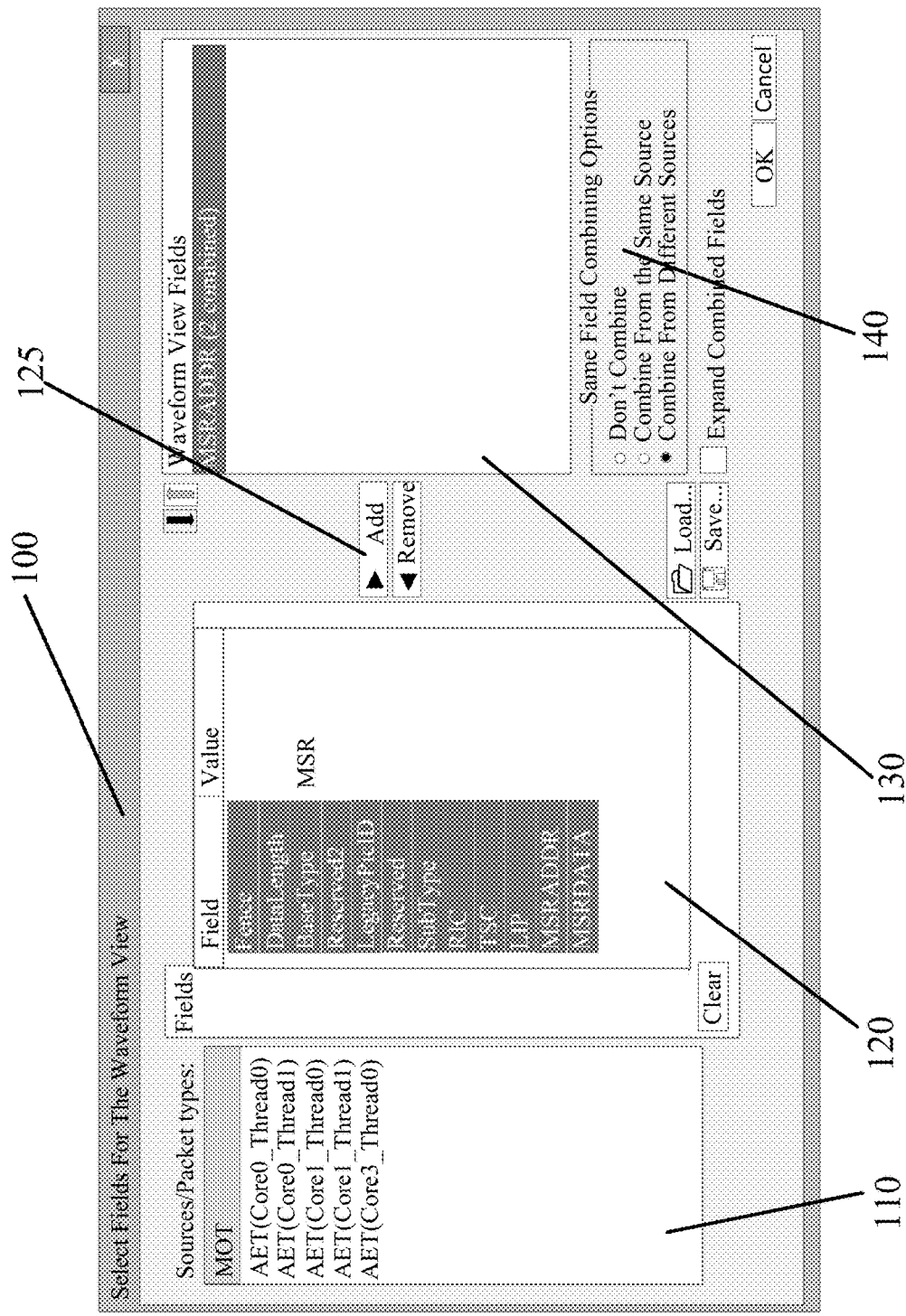
FIG. 6 is a graphical display depicting selection of a field from multiple sources in accordance with an embodiment of the invention.

Referring next to FIG. 6, the steps that may be employed for selecting a field from different sources when the fields have the same name is shown. As is shown in FIG. 6, these steps may preferably comprise the following.

Figure 7:
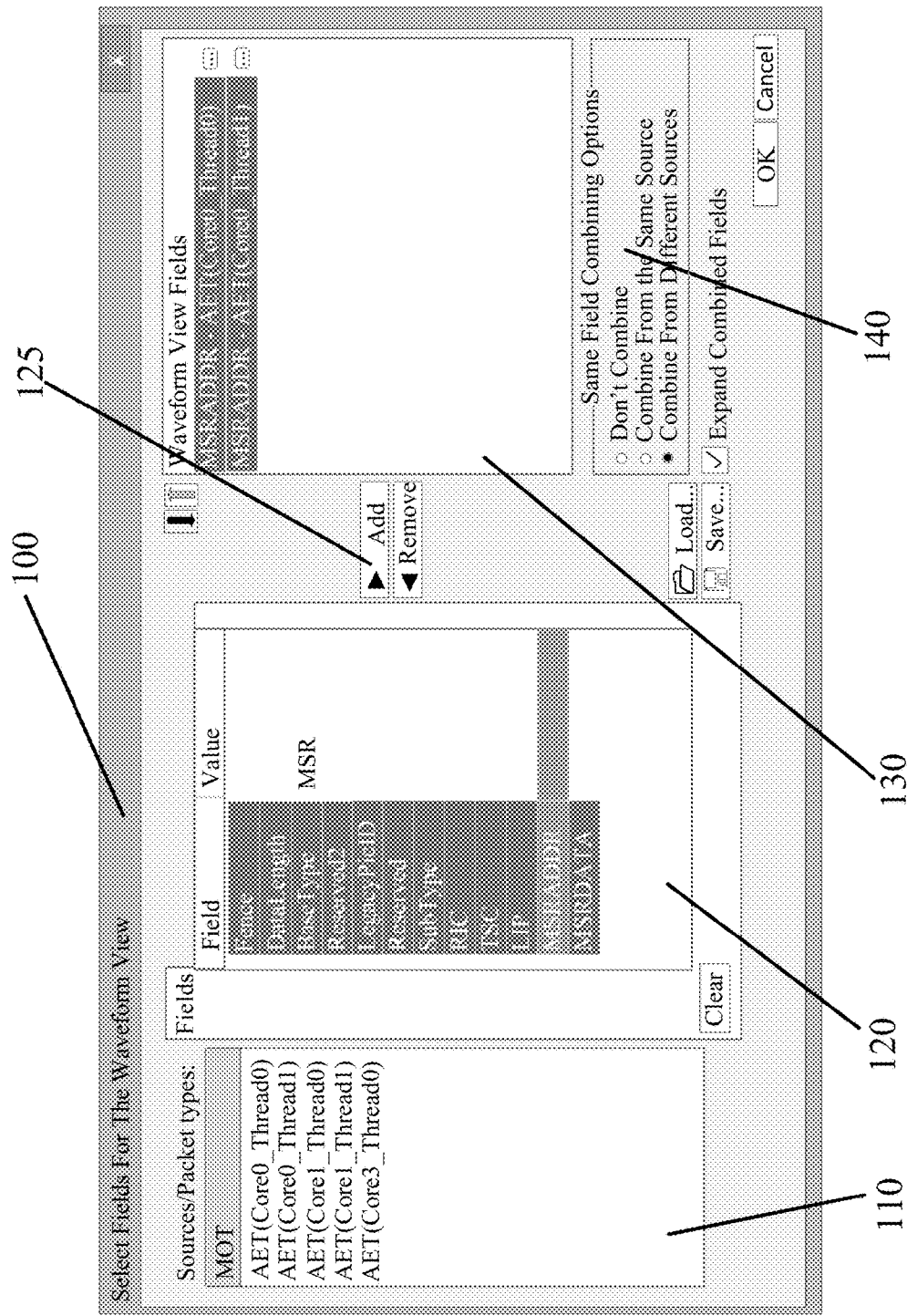
FIG. 7 is a graphical display depicting selection of a field from multiple sources showing expanded combined fields in accordance with an embodiment of the invention.

If user wants to select fields from different sources when all the fields have the same name (i.e. AET fields from different CoreX_ThreadY sources) then user actions can be described as follows:
1. Select "Combine From Different Sources" field combination option using the appropriate radio button 140.
2. Select the first source in source selection pane 110.
3. Select and set values of the fields which define the first pre-condition of the "conditional" field in field selection pane 120, then subsequently select the "conditional" field in field selection pane 120 and click "Add" button 125 (or double-click the field in the Field selection pane).
4. Select the next source in source selection pane 120, and repeat actions described in the item 3 for the fields.
5. The field selection combining multiple fields will appear in the Selected/Combine Field pane 130. Note that as in FIG. 4, the "expand combined fields radio button in section 140 is not selected, and thus, because there are two preconditions set there is an indication of two combined preconditions associated with this field. If the 'expand combined fields" radio button is selected, the result is as shown in FIG. 7, in which each precondition is separately shown in Selected/Combine Field pane 130.

Figure 8:
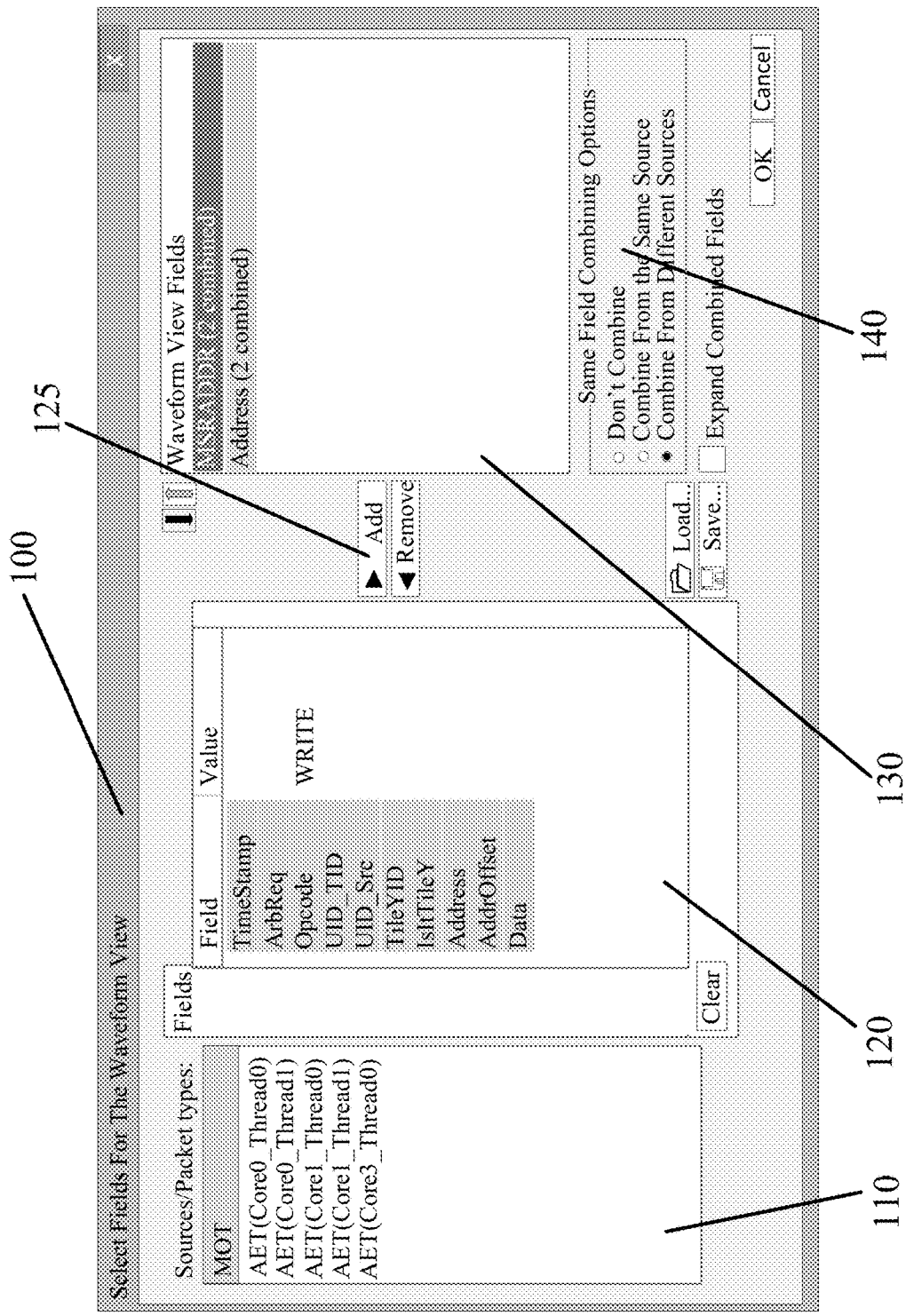
FIG. 8 is a graphical display depicting selection of fields from different sources to make a combination in accordance with an embodiment of the invention.

Referring next to FIG. 8, manual field selection when fields have different names and different sources are to be employed will be described. Such manual selection may be necessary or preferable because field combination options provided for automation by the inventive field selection GUI may not be able to automatically determine how to combine user field selections into one virtual field. In such a situation, the GUI preferably aids the user in creating field combinations manually.

Therefore, as is shown in FIG. 8, steps for a user to perform these actions may comprise the following.
1. Select any of the field combination options using radio buttons 140 that allow the user to get close to a desired result.
2. Select the first source in source selection pane 110.
3. Select and set values of the fields which define preconditions of the "conditional" field in field selection pane 120, then subsequently select the "conditional" field in the field selection pane 120 and click "Add" button 125 (or double-click the field in the Field selection pane).
4. Select the next source in source selection panel 110 and repeat actions described in the item 3 or the fields in field selection panel 120.
5. Field selections combining multiple fields with the same name will appear in the Selected/Combine Field pane 130. As is shown in FIG. 8, each of the combinations is shown in pane 130.

Figure 9:
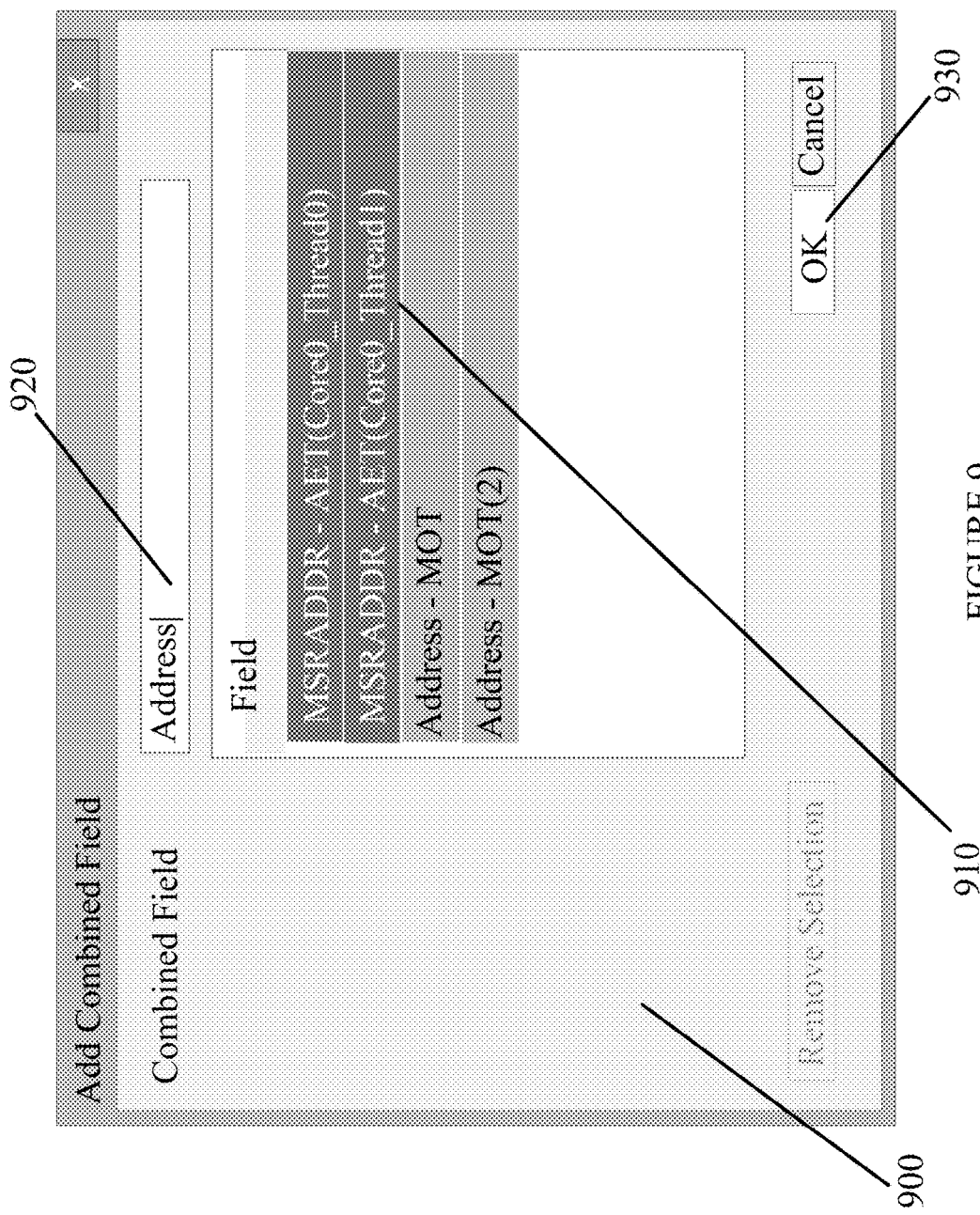
FIG. 9 is a graphical display depicting an add combined field dialog box in accordance with an embodiment of the invention.

Processing then passes to the steps depicted in FIG. 9, in which
1. First, the user may select one or more fields from pane 130 to combine (MSRADDR and Address in our example as shown in FIG. 8).
2. Right clicking, or otherwise further selecting the selected fields then may pull up the add combined field dialog 900, as shown in FIG. 9. Once dialog 900 is shown, each field definition 910 (corresponding to the fields previously shown in pane 130 of FIG. 8) is shown in expanded form. The use is preferably prompted to type a name for the combined field in area 920, and then select the OK button 930 to close the add combined field dialog box 900.

Figure 10:
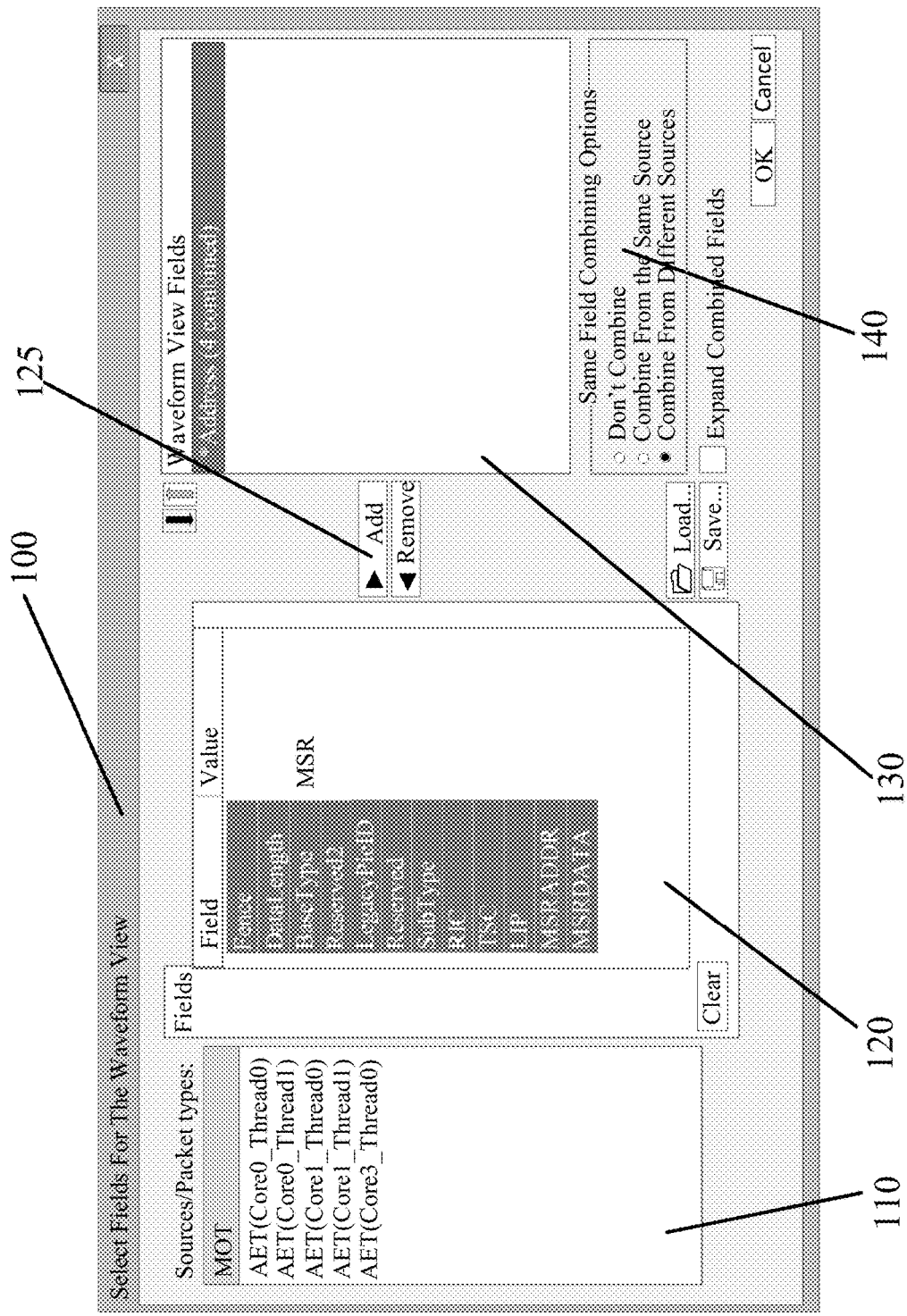
FIG. 10 is a graphical display depicting a result of manually combining fields from different sources in accordance with an embodiment of the invention.

The result is shown in FIG. 10, in which a manually combined custom field labeled "Address" containing multiple field selections is shown in panel 130, and includes a designation of 4 combined fields therein. If the expand combined fields checkbox radio button in portion 140 is checked then panel 130 will display all field selections from different sources that were combined automatically based on selected field combination options. But manually combined fields still will be shown as combined fields. This allows the user to easily add new field selections to the manually combined fields, as will now be described. Of course, it may be possible to display all of the fields in an expanded format, if desired.

In accordance with this particular embodiment of the invention, in order to see all field selections used to build a combined field, the user may preferably select the combined field and right-click or otherwise indicate similar selection of the field. This action will cause the "Add Combined Field" dialog 900 (See FIG. 9) to pop up and display all the field selections used to build the combined field. If the "Expand Combined Fields" checkbox is checked all automatic field combinations are "unrolled", so it is possible to create manual field combinations using field selections that are parts of automatic field combinations. In this case field selections used by manual field combinations will be removed from automatic field combinations. In alternative embodiments of the present invention, the user may be provided with the ability to unroll one or more field selections individually by selection of a proper indicator or the like.

Figure 11:
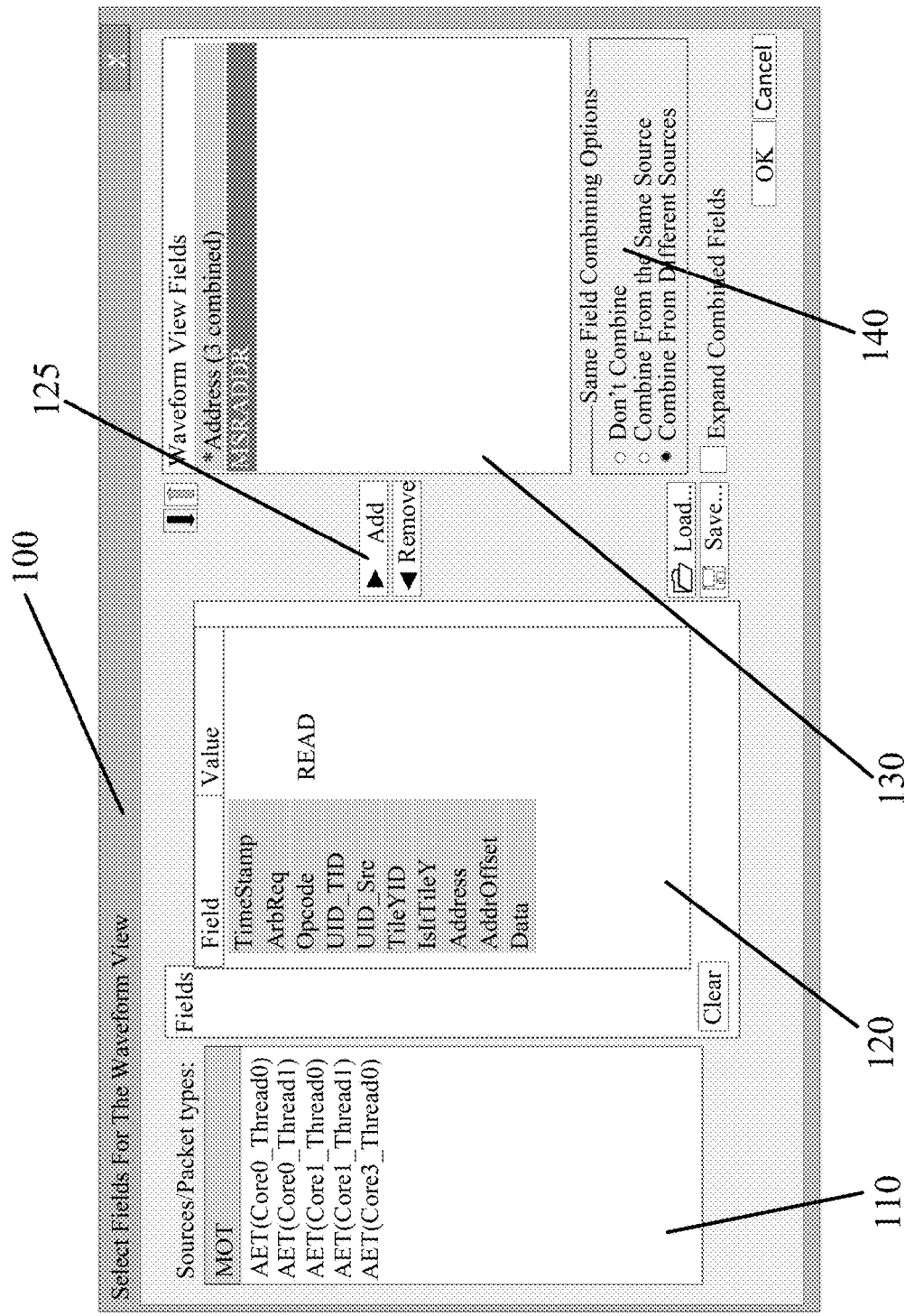
FIG. 11 is a graphical display depicting selection of a field to be added to a manually created field combination in accordance with an embodiment of the invention.
Figure 12:
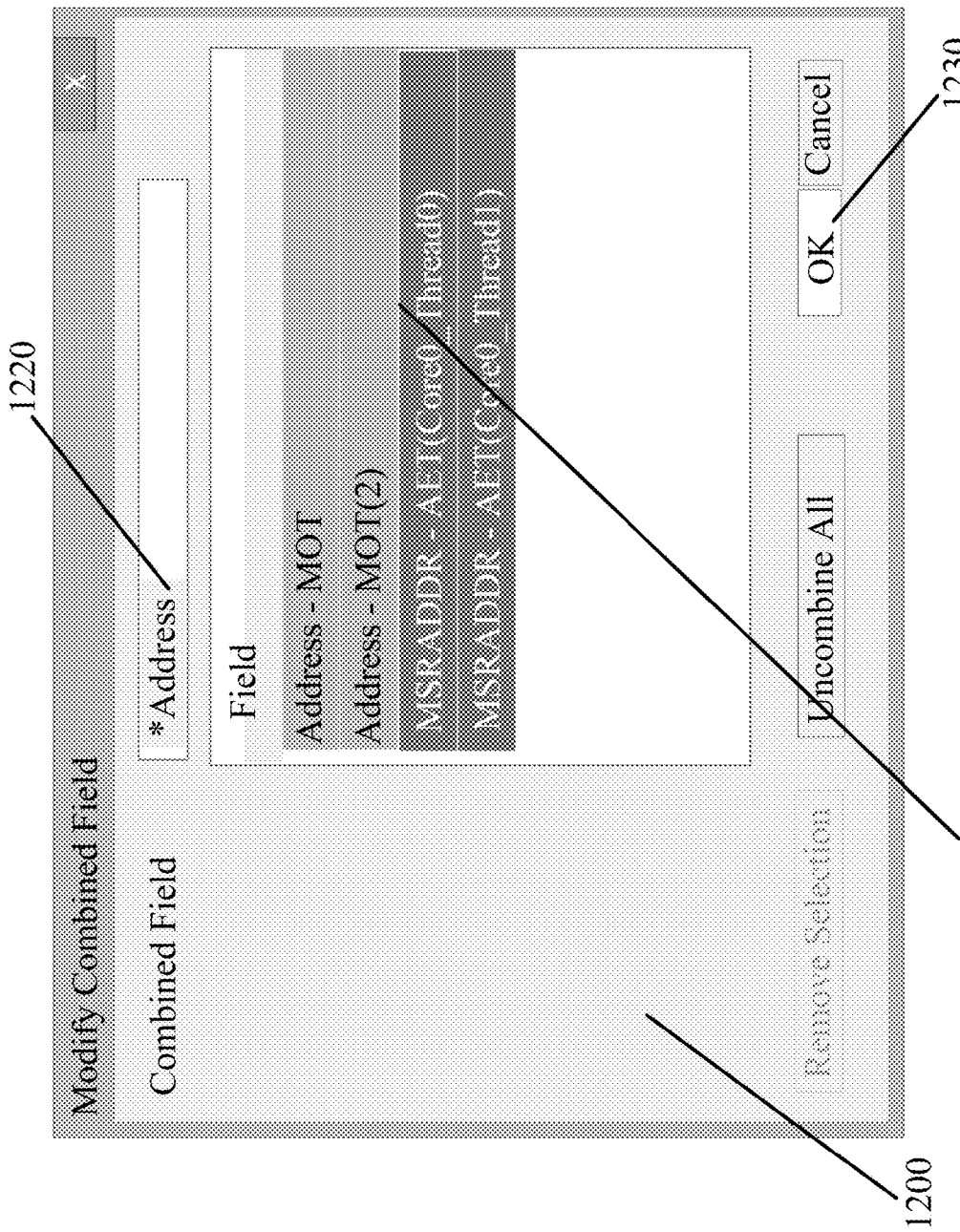
FIG. 12 is a graphical display depicting a modify combined field dialog box in accordance with an embodiment of the invention.
Figure 13:
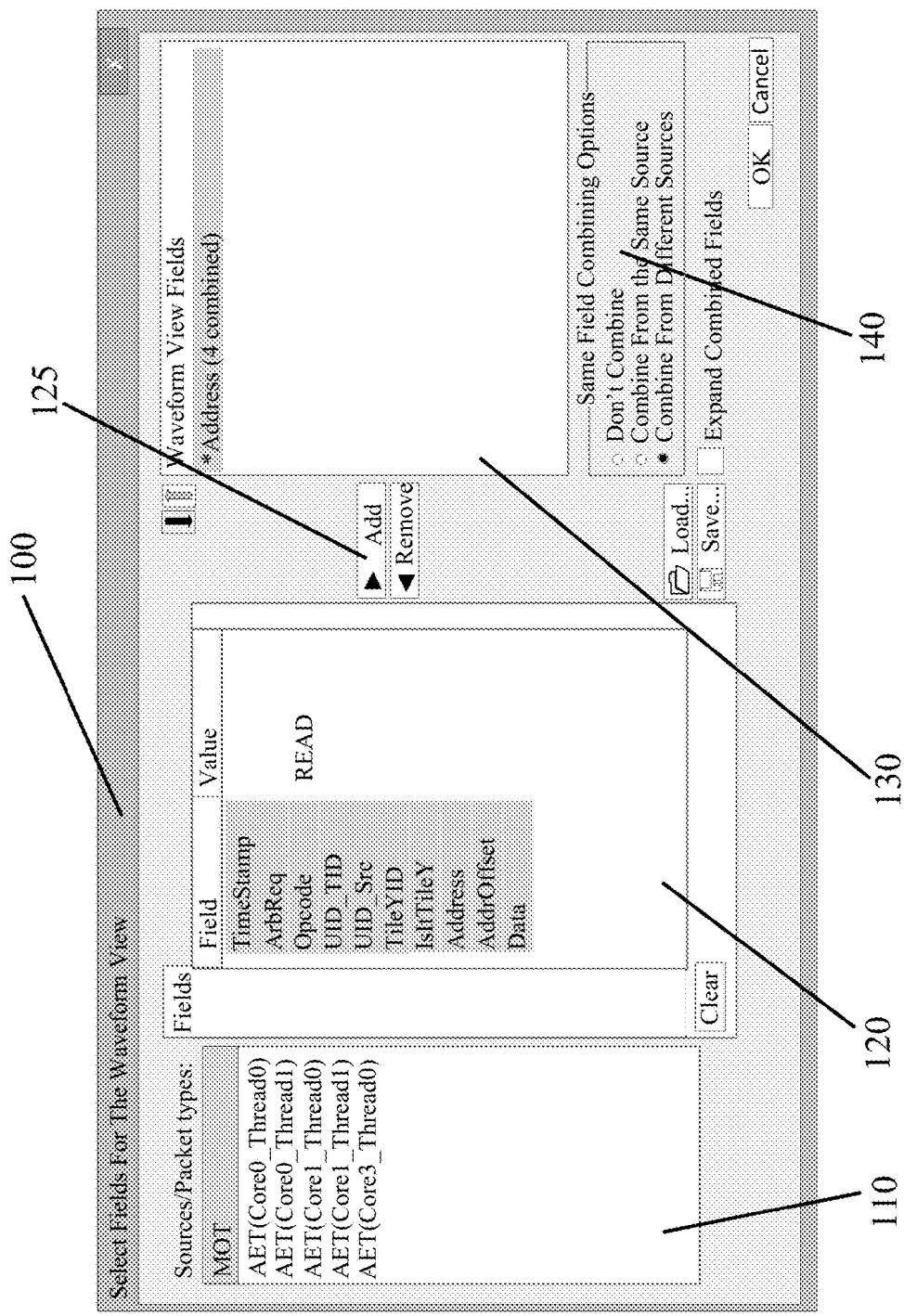
FIG. 13 is a graphical display depicting a result of manually combining fields in accordance with an embodiment of the invention.

In order to create a new field selection that may be added to one of the manually created combination, the process may comprise the following steps, referring to FIG. 11.
1. Create a new field selection preferably by the manual method described above, as a single entity field selection, or through any other appropriately indicated method.
2. Select both the manually created combined field and the field added in item 1 from panel 130, in the manner as shown in FIG. 11.
3. Right click or otherwise select one of the previously selected fields in pane 130. This selection will once again bring up a modify combined field dialog box 1200. Dialog box 1200 will list all of the previous field selections that were manually combined 1210, along with the new field entry, as is shown in FIG. 12.
4. The user is then asked to enter a name in dialog box 1220 and to select okay button 1230 to create a new combination that will include all of the listed field selections. The result is shown in FIG. 13, in which the field selection has been added to the manually created combination in panel 130.

Figure 14:
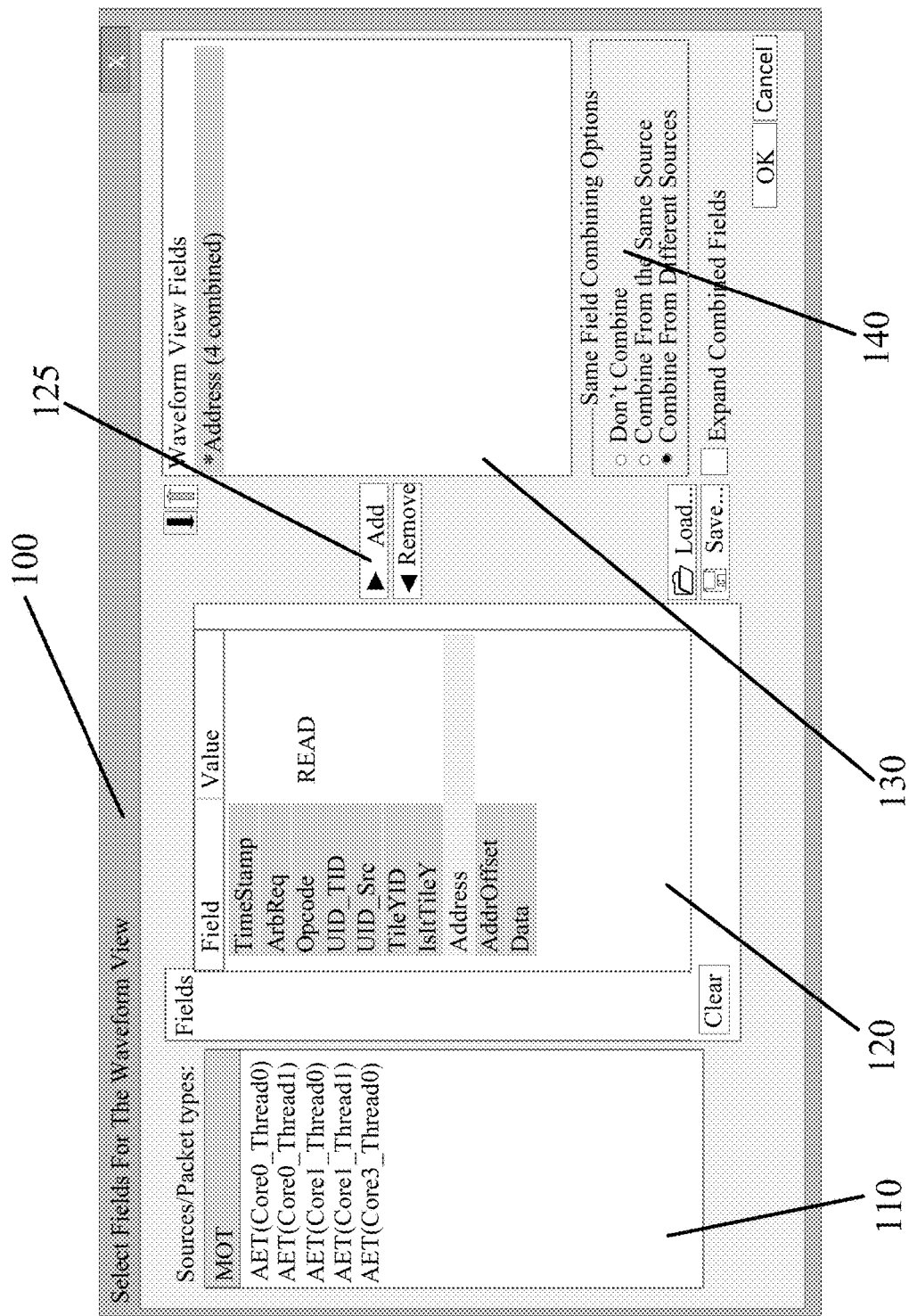
FIG. 14 is a graphical display depicting selection of a field to be removed from a manually created field combination in accordance with an embodiment of the invention.

Once a manually created field combination is generated, it may be desirable for the user, at some point, to remove one or more of the field selections from the manually created field selection. The GUI in accordance with an embodiment of the invention provides a convenient manner for the user to perform this operation. This operation preferably comprises the following steps.
1. Select a manually created combination from panel 130, as shown in FIG. 14.

Figure 15:
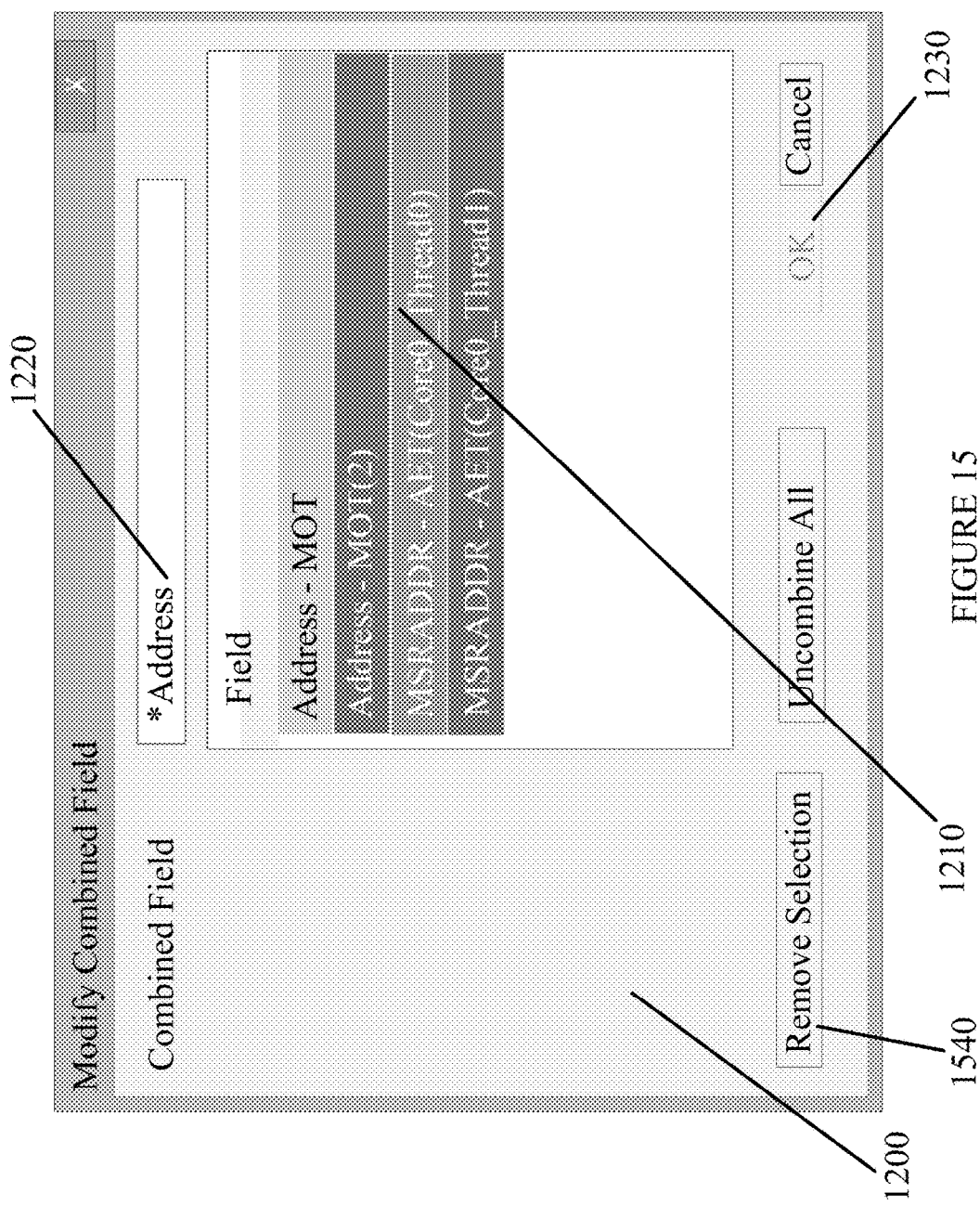
FIG. 15 is a graphical display depicting a modify combined field dialog box in accordance with an embodiment of the invention.
Figure 16:
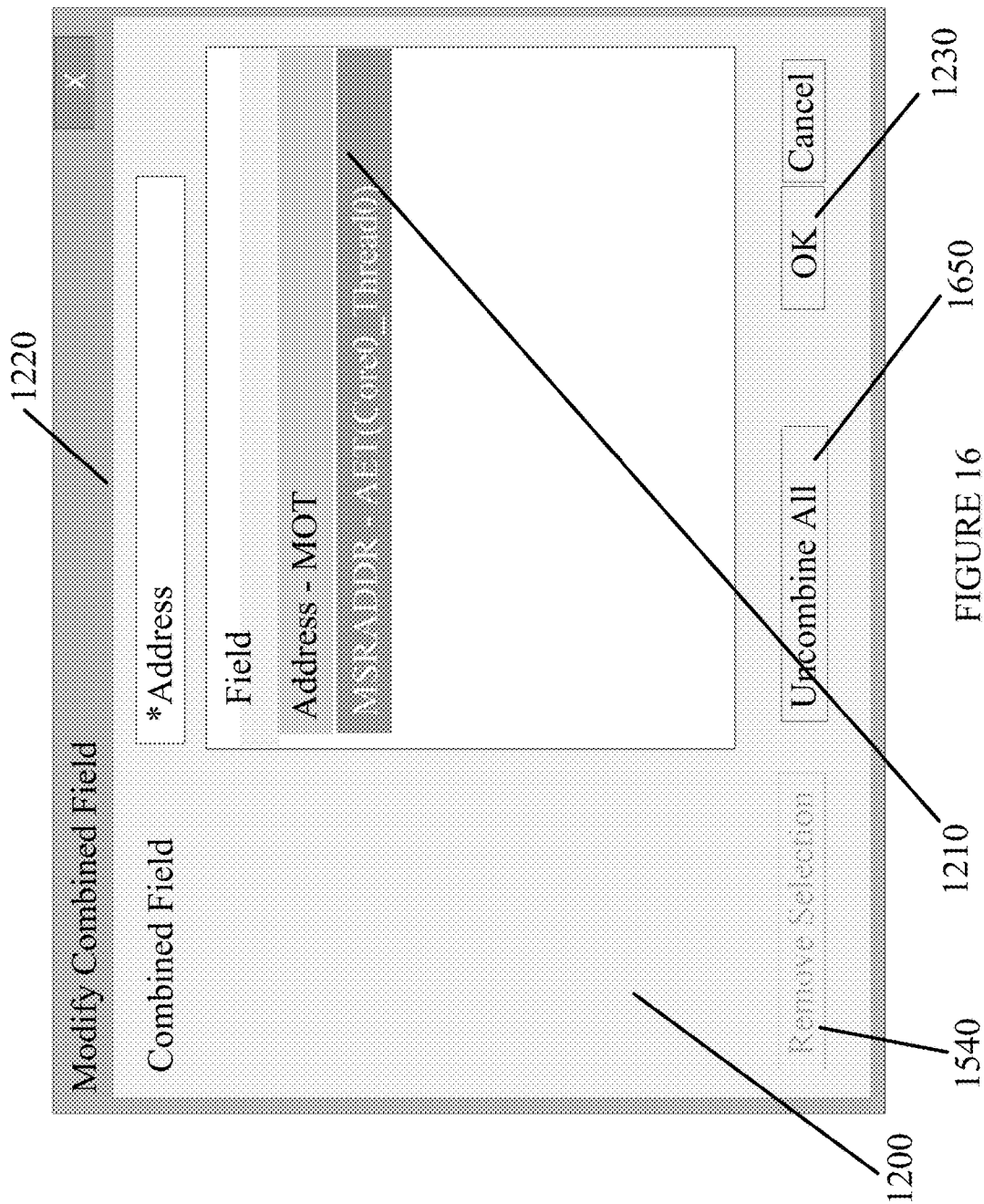
FIG. 16 is a graphical display depicting a modify combined field dialog box after removing fields in accordance with an embodiment of the invention.
Figure 17:
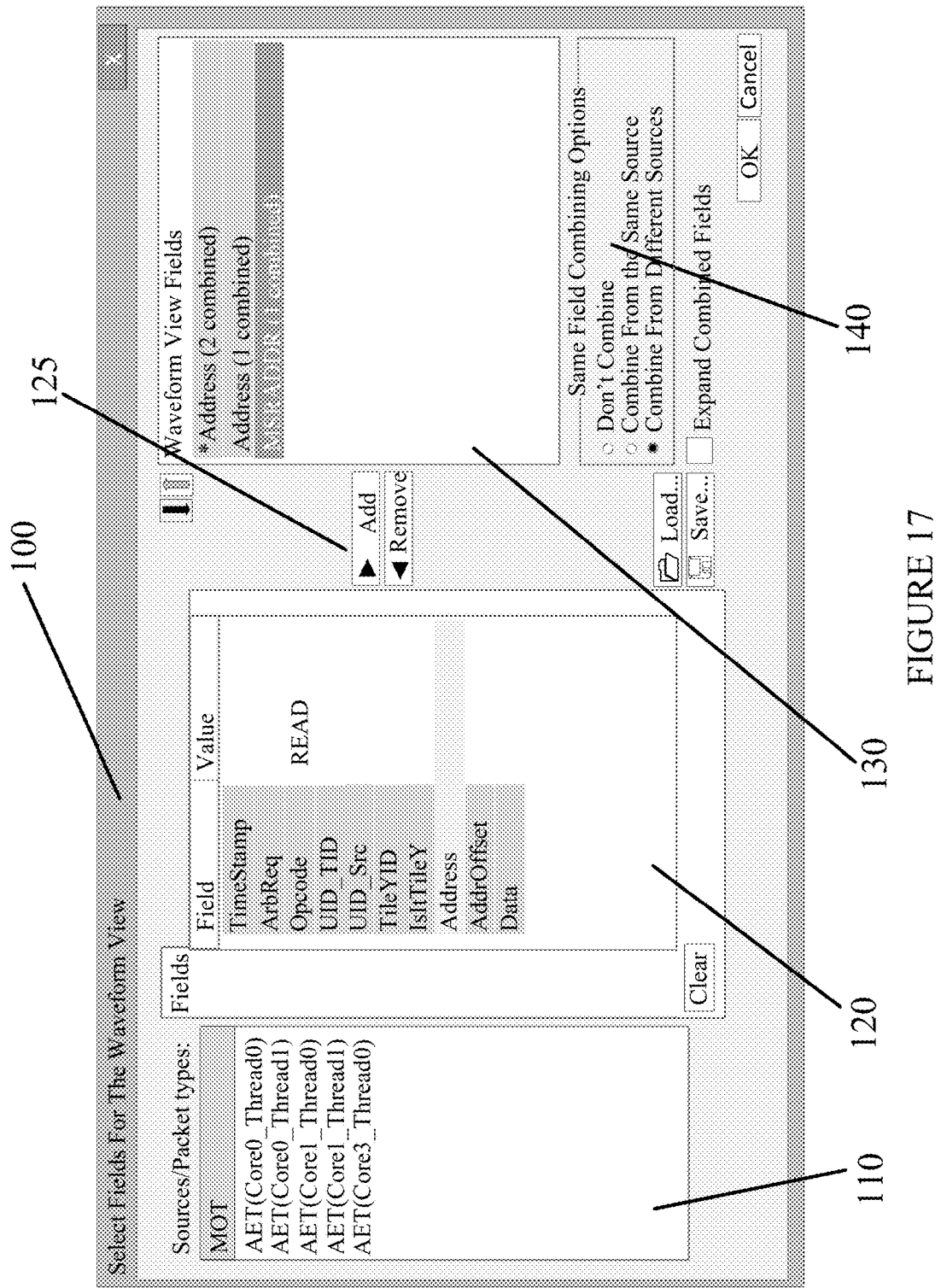
FIG. 17 is a graphical display depicting a result of removing fields in accordance with an embodiment of the invention.

2. Right click or otherwise appropriately select the previously selected manually created combination to bring up the modify combined field dialog box 1200 as shown in FIG. 14.
3. As is further shown in FIG. 15, one or more field selection that are to be removed from the manually created combined field are preferably selected, and a remove selection button 1540 is selected to remove the selected field selections. FIG. 16 depicts the resulting state of modify combined field dialog box 1200, showing that the previously selected field selection is no longer present. FIG. 17 further presents dialog box 100 depicting the changes in panel 130.
4. If it is determined by the user that they wish to uncombined the entire manually created combined field, then an uncombined all button 1650 in FIG. 16 may be selected. As a result, the entire manually created combined field will be uncombined.

Referring once again to FIG. 1, if they don't combine radio button 140 is selected, no automatic combinations will be performed or generated. This option preferably turns off automatic field combining and may instruct the GUI to create a Wave Form View line for each field selection, regardless of whether the field selections logically belong to the same field or not. This option may also preferably affect only automatic field combinations, and may not affect manually combined fields. So it is possible, in accordance with one or more embodiments of the present invention, to manually create field combinations when this combination option is selected.

In accordance with one or more embodiments of the present invention, it may be desirable to select one or more subfields from a whole field, and to display these subfields in a wave form view display. Subfields may be combined with a whole field and then they establish a "field group" in the Wave Form View—where a whole field is represented by a Wave Form View line and subfields are represented by a Wave Form View subline. Subfields may also be used to build separate Wave Form View lines in case when their parent field is not selected.

In a particular exemplary embodiment of the invention, in order to combine a field and its subfields into a field group, all of the fields and subfields preferably have the same preconditions. The case when field and some subfield have different preconditions may be classified as not valid and not accepted by the Field Selection GUI of this embodiment of the invention. Of course, in one or more alternative embodiments of the invention, this combination may be allowed and declared valid.

Figure 18:
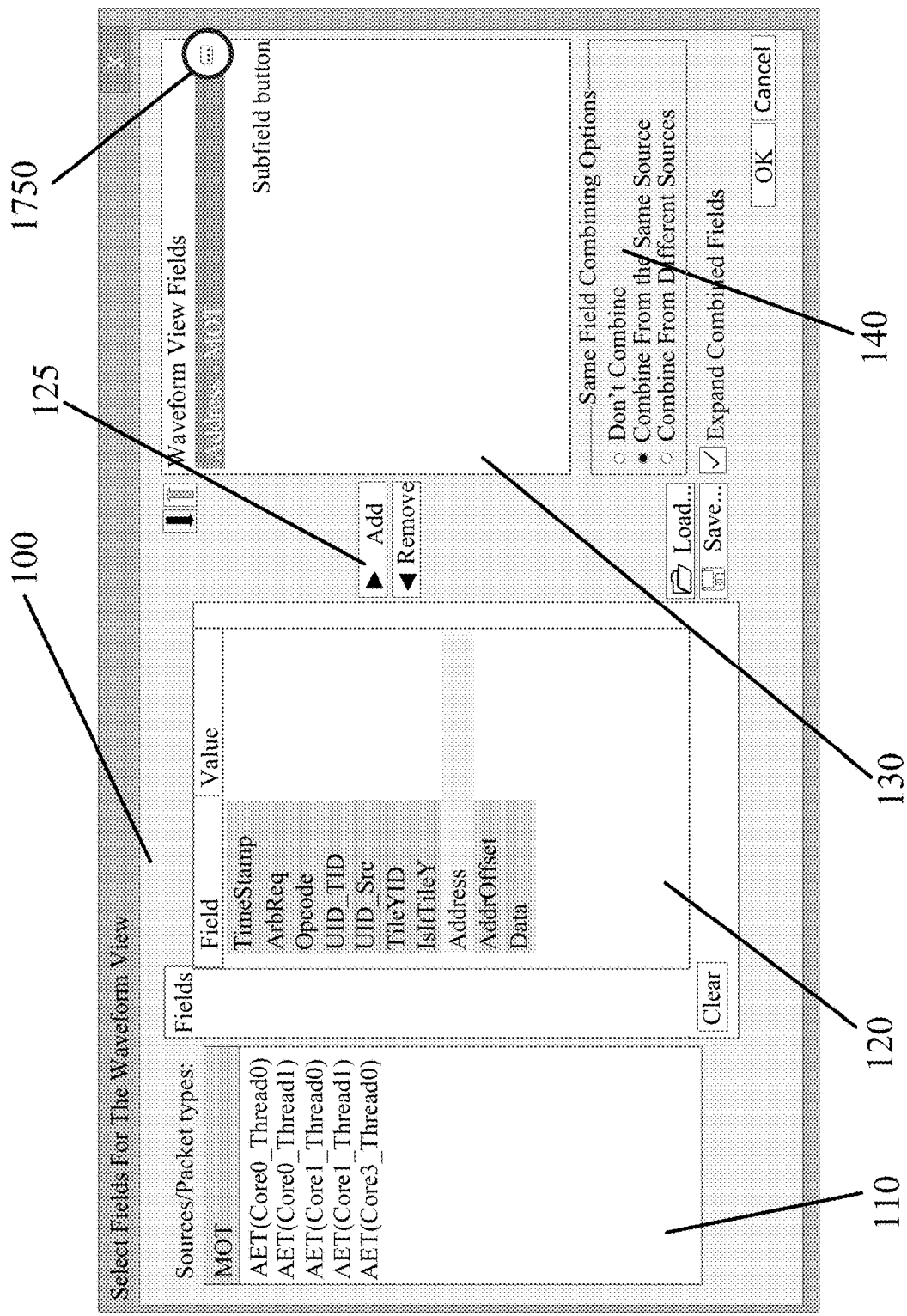
FIG. 18 is a graphical display depicting definition of a subfield in accordance with an embodiment of the invention.
Figure 19:
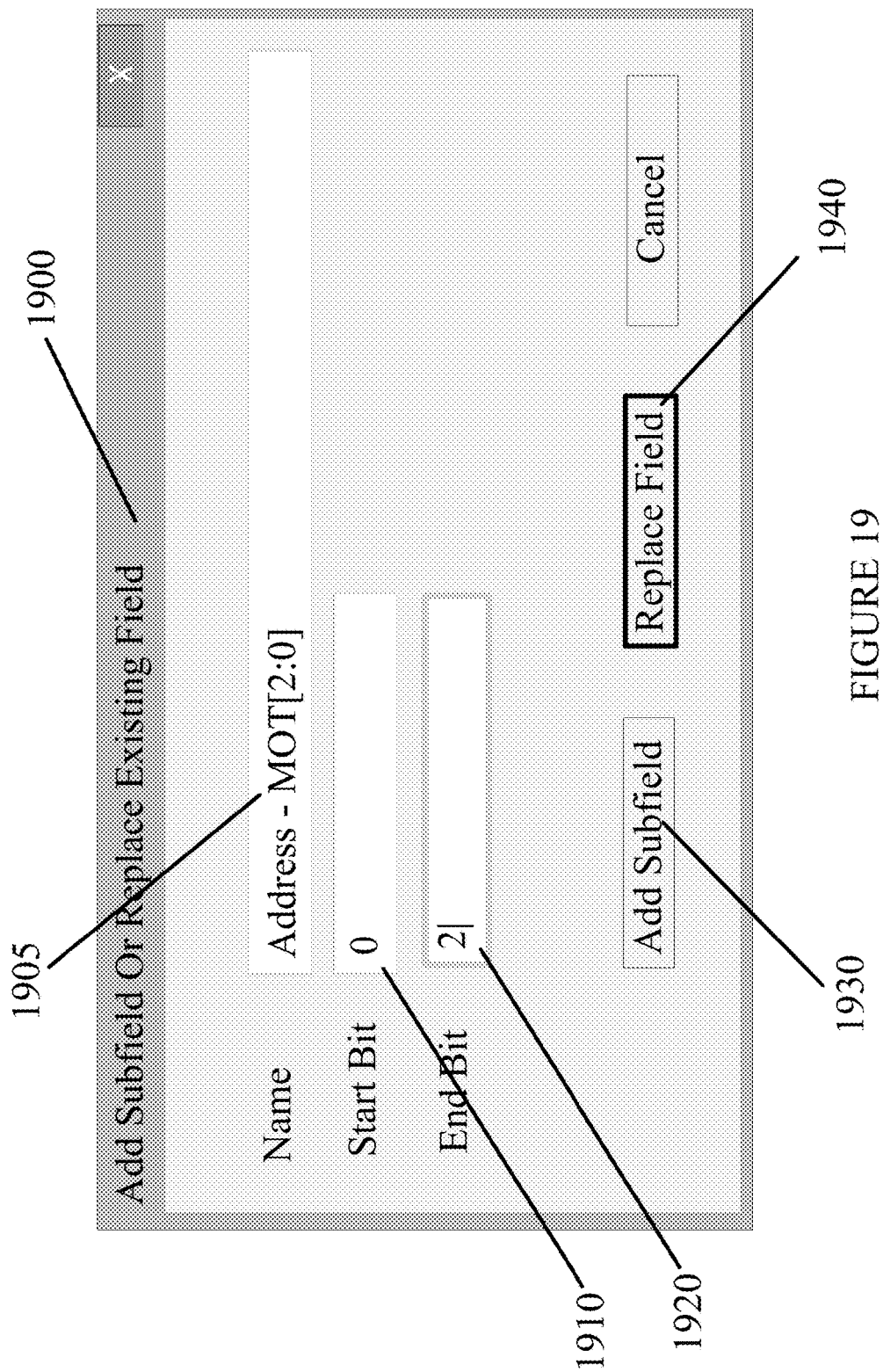
FIG. 19 is a graphical user interface display depicting an add subfield or replace existing field dialog box in accordance with an embodiment of the invention.

In order to select a subfield, the process may preferably comprise the following steps, as first shown in FIG. 18.
1. Select a parent field as noted above from panel 120, and then select subfield button 1750.
2. Once the add subfield or replace existing field dialog box 1900 appears, as shown in FIG. 19, starting and ending bit fields 1910, 1920 may be provided to designate the starting and ending locations of the subfield. The subfield name may also be changed in field 1905 if the auto generated name is not preferred.
3. By selecting the add subfield button 1930 the subfield is added to the field group, as is shown panel 130 in FIG. 20.
4. Alternatively, replace field button 1940 allows for the replacement of the field with the defined subfield.

As noted above, in accordance with this embodiment of the invention, a parent field and any such subfields are preferably defined as a single field group having the same preconditions. As such, and change in a precondition for either the parent field, or any of the subfields results in a change in preconditions for the entire field group, including the parent and all associated subfields. This allows for valid field groups to be maintained, as such field groups preferably al have the same preconditions in order to remain valid, and to thus be accepted by the field selection GUI of one or more embodiments of the present invention.

Figure 20:
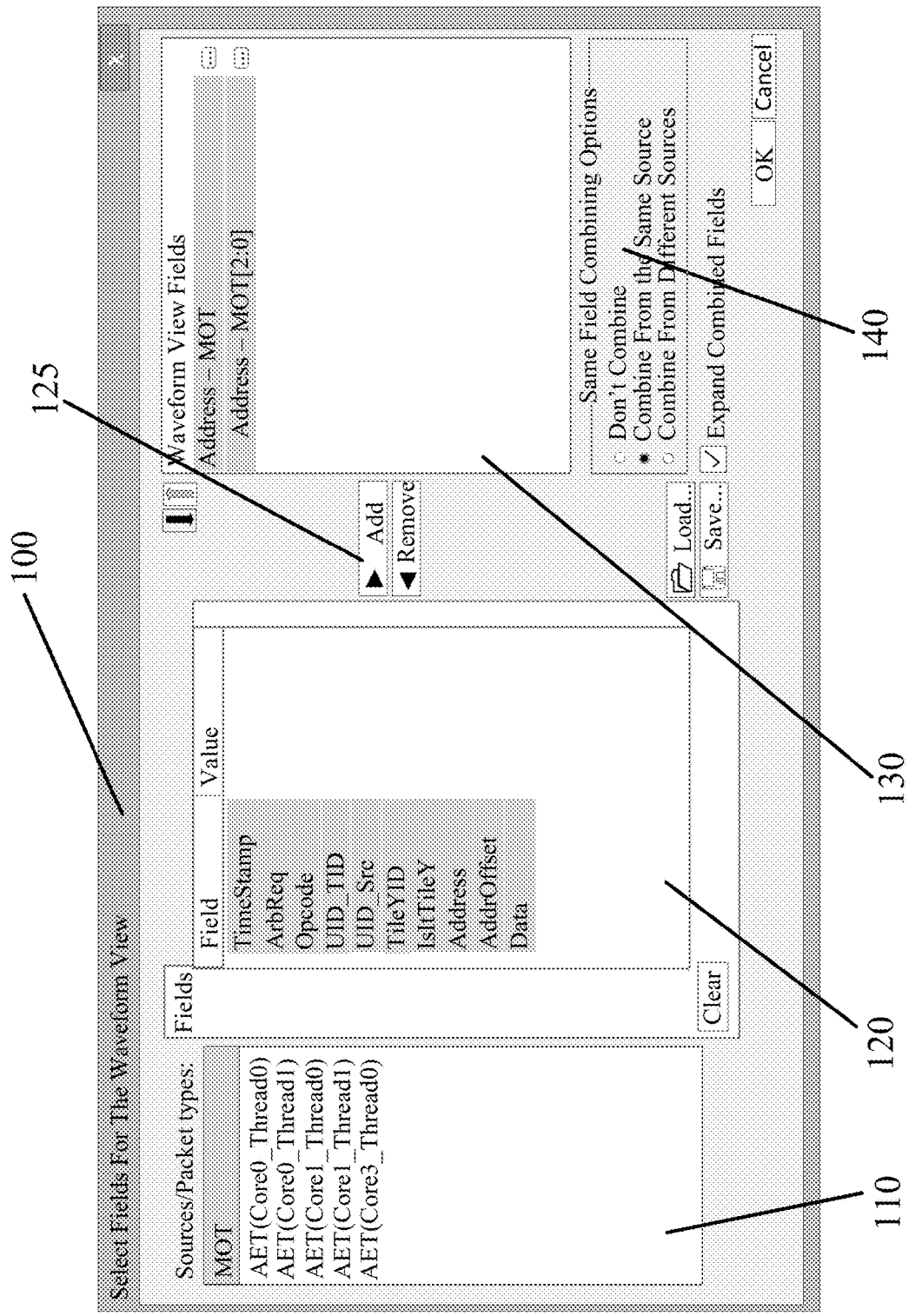
FIG. 20 is a graphical display depicting a result of adding a subfield in accordance with an embodiment of the invention.
Figure 21:
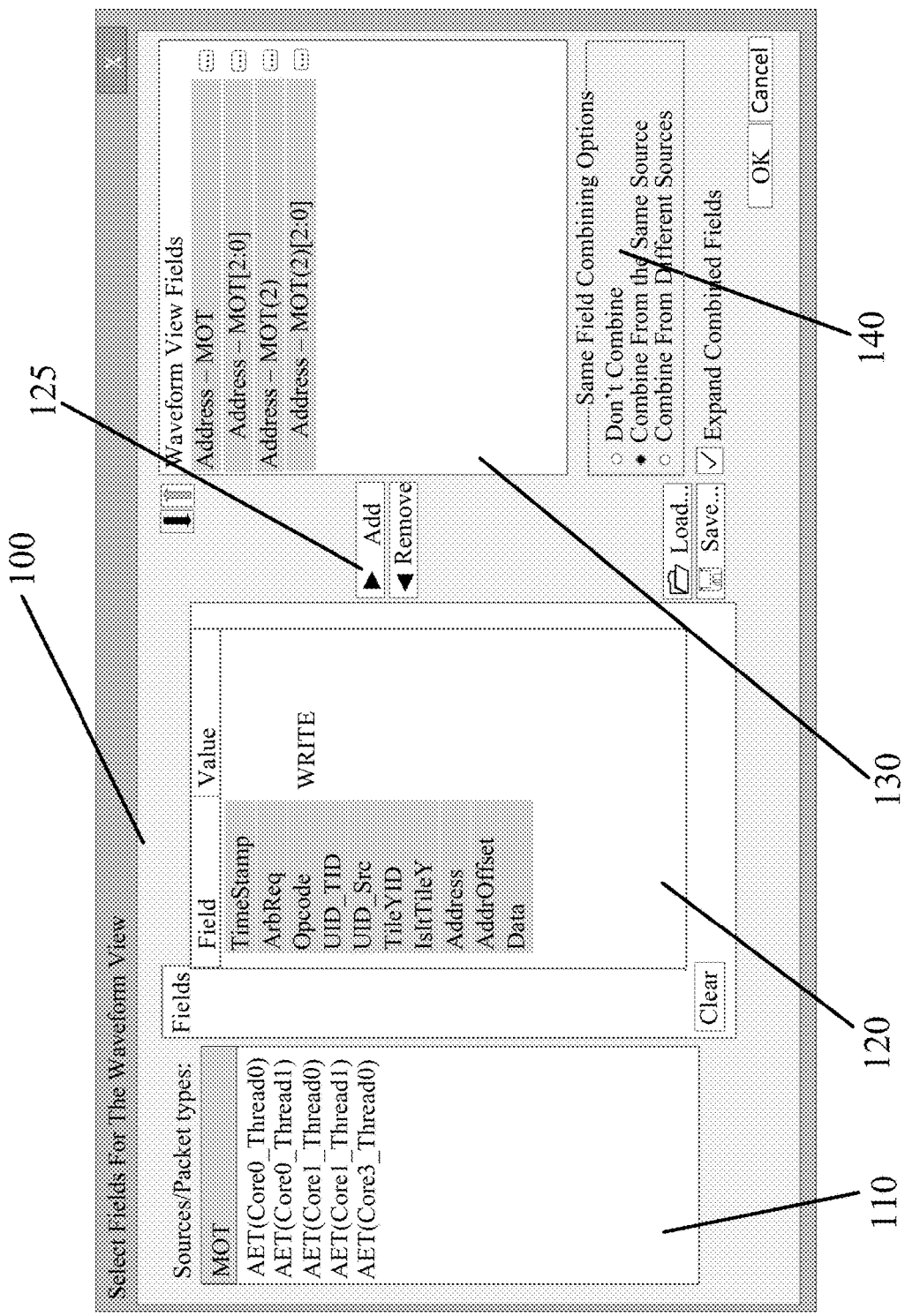
FIG. 21 is a graphical display depicting a result of defining different field groups for a single field having different preconditions in accordance with an embodiment of the invention.

If, on the other hand, it is desirable to provide a field group where a field and subfields may have different preconditions, such a situation is preferably handled by creating two different field groups having different preconditions, by based upon the same field. In this manner, the steps of FIGS. 18-20 are preferably performed, first for a selected field with a set of relates subfields and preconditions, and next for the selected field again (perhaps with the same or different subfields) and on or more different preconditions. The result will be as shown in FIG. 21 in which a same parent field is listed twice in pane 130. If it is desirable to have the field represented by one set of a wave form line and sub lines, even with multiple field groups describing the same field with different preconditions, the combine from the same source radio button from radio buttons 140 may be selected. Alternatively, selecting the don't combine radio button from radio buttons 140 may be selected, thus resulting in each field group being represented by different sets of waveform and sub lines.

Therefore, in accordance with the invention, a user is able to easily set one or more preconditions for a field group, and to easily display results. The various embodiments of the invention allow for a user to present complex field combination and definition logic in accordance with the processing of a protocol analyzer. Complex virtual fields may be built from other complex, or aggregate, fields and/or simple fields, thus allowing the user to build very complex virtual fields with complex aggregate preconditions, thus resulting in a final combined field, perhaps having multiple preconditions from any number of selected fields and sub fields, and thus presenting a very complex condition.

While the application is described as a GUI for use with a protocol analyzer, such GUI may be employed with any computer, general or special purpose, with sufficient processors, memory, storage, and programming to perform the job of such a protocol analyzer. The protocol analyzer or other general purpose computer preferably has an input for receiving one or more data streams, a processor for processing the one or more received data streams, and a display for displaying the output from the processor, as well as a graphical user interface as defined in accordance with the various embodiments of the invention. Of course, other well known components of a protocol analyzer or other general purpose computer may also be provided. This application further may be directed to a software package or instruction stored in a non-transitory, computer readable storage medium, that when employed by a general or special purpose computer, cause the computer to perform the functions described herein.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A computer-implemented method, comprising:
   receiving, by a protocol analysis device, first user inputs that include:
   (i) user selection of a first source from a list of sources that are presented on a display of the protocol analysis device,
   (ii) user selection of a first field from a list of fields that are for the first source and that are presented on the display, and
   (iii) user selection of a first precondition that is associated with the selected first field;
   presenting, on the display of the protocol analysis device in response to the protocol analysis device having received the first user inputs, a graphical indication that the protocol analysis device is to present data from the first field;
   receiving, by the protocol analysis device, second user inputs that include:
   (i) user selection of a second source from the list of sources that are presented on the display,
   (ii) user selection of a second field from a list of fields that are for the second source and that are presented on the display, and
   (iii) user selection of a second precondition that is associated with the selected second field;
   determining, by the protocol analysis device in response to the protocol analysis device having received the first user inputs and the second user inputs, that the first user inputs and the second user inputs include selections in which:
   (a) the first source and the second source are same, the first field and the second field are same, and the first precondition and the second precondition are different, or
   (b) the first source and the second source are different, the first field and the second field are same, and the first precondition and the second precondition are same; and
   replacing, by the protocol analysis device in response to the determination, the graphical indication that the protocol analysis device is to present data from the first field with a combined graphical indication that the protocol analysis device is to present data from the first field and the second field.

2. The computer-implemented method of claim 1, wherein:
   the list of sources is a list of types of packets;
   the first source is a first type of packet; and
   the second source is a second type of packet.

3. The computer-implemented method of claim 2, wherein:
   the list of fields that are for the first source is a list of fields included in the first type of packet; and
   the list of fields that are for the second source are a list of fields included in the second type of packet.

4. The computer-implemented method of claim 1, wherein:
   the first precondition that is associated with the selected first field is a precondition for the protocol analysis device presenting data from the first field; and
   the second precondition that is associated with the selected second field is a precondition for the protocol analysis device presenting data from the second field.

5. The computer-implemented method of claim 1, wherein:
   the first precondition specifies a first value for another field from the list of fields that are for the first source; and
   the second precondition specifies a second value for another field from the list of fields that are for the second source.

6. The computer-implemented method of claim 1, comprising:
   determining, by the protocol analysis device in response to the protocol analysis device having received the first user inputs and the second user inputs, that the first user inputs and the second user inputs include selections in which the first source and the second source are same, the first field and the second field are same, and the first precondition and the second precondition are different.

7. The computer-implemented method of claim 1, comprising:
   determining, by the protocol analysis device in response to the protocol analysis device having received the first user inputs and the second user inputs, that the first user inputs and the second user inputs include selections in which the first source and the second source are different, the first field and the second field are same, and the first precondition and the second precondition are same.

8. The computer-implemented method of claim 1, wherein the replacing the graphical indication that the protocol analysis device is to present data from the first field with the combined graphical indication that the protocol analysis device is to present data from the first field and the second field is performed automatically.

9. The computer-implemented method of claim 1, comprising:
   receiving, by the protocol analysis device, third user input to expand the combined graphical indication that the protocol analysis device is to present data from the first field and the second field;
   replacing, by the protocol analysis device in response to receiving the third user input, the combined indication that the protocol analysis device is to present data from the first field and the second field with (a) the graphical indication that the protocol analysis device is to present data from the first field, and (b) a different graphical indication that the protocol analysis device is to present data from the second field.

10. A protocol analysis device, comprising:
    an input for receiving one or more data streams;
    a processor for processing the one or more input data streams;
    a display for displaying results of the processing of the one or more input data streams; and
    non-transitory computer-readable storage medium that, when employed by the processor, causes the processor to perform operations including:
    receiving, by a protocol analysis device, first user inputs that include:
    (i) user selection of a first source from a list of sources that are presented on a display of the protocol analysis device,
    (ii) user selection of a first field from a list of fields that are for the first source and that are presented on the display, and
    (iii) user selection of a first precondition that is associated with the selected first field;

presenting, on the display of the protocol analysis device in response to the protocol analysis device having received the first user inputs, a graphical indication that the protocol analysis device is to present data from the first field;

receiving, by the protocol analysis device, second user inputs that include:
(i) user selection of a second source from the list of sources that are presented on the display,
(ii) user selection of a second field from a list of fields that are for the second source and that are presented on the display, and
(iii) user selection of a second precondition that is associated with the selected second field;

determining, by the protocol analysis device in response to the protocol analysis device having received the first user inputs and the second user inputs, that the first user inputs and the second user inputs include selections in which:
(a) the first source and the second source are same, the first field and the second field are same, and the first precondition and the second precondition are different, or
(b) the first source and the second source are different, the first field and the second field are same, and the first precondition and the second precondition are same; and replacing, by the protocol analysis device in response to the determination, the graphical indication that the protocol analysis device is to present data from the first field with a combined graphical indication that the protocol analysis device is to present data from the first field and the second field.

11. The protocol analysis device of claim 10, wherein:
the list of sources is a list of types of packets;
the first source is a first type of packet; and
the second source is a second type of packet.

12. The protocol analysis device of claim 11, wherein:
the list of fields that are for the first source is a list of fields included in the first type of packet; and
the list of fields that are for the second source are a list of fields included in the second type of packet.

13. The protocol analysis device of claim 10, wherein:
the first precondition that is associated with the selected first field is a precondition for the protocol analysis device presenting data from the first field; and
the second precondition that is associated with the selected second field is a precondition for the protocol analysis device presenting data from the second field.

14. The protocol analysis device of claim 10, wherein:
the first precondition specifies a first value for another field from the list of fields that are for the first source; and
the second precondition specifies a second value for another field from the list of fields that are for the second source.

15. The protocol analysis device of claim 10, wherein the operations comprise:
determining, by the protocol analysis device in response to the protocol analysis device having received the first user inputs and the second user inputs, that the first user inputs and the second user inputs include selections in which the first source and the second source are same, the first field and the second field are same, and the first precondition and the second precondition are different.

16. The protocol analysis device of claim 10, wherein the operations comprise:
determining, by the protocol analysis device in response to the protocol analysis device having received the first user inputs and the second user inputs, that the first user inputs and the second user inputs include selections in which the first source and the second source are different, the first field and the second field are same, and the first precondition and the second precondition are same.

17. The protocol analysis device of claim 10, wherein the replacing the graphical indication that the protocol analysis device is to present data from the first field with the combined graphical indication that the protocol analysis device is to present data from the first field and the second field is performed automatically.

18. The protocol analysis device of claim 10, wherein the operations comprise:
receiving, by the protocol analysis device, third user input to expand the combined graphical indication that the protocol analysis device is to present data from the first field and the second field;
replacing, by the protocol analysis device in response to receiving the third user input, the combined indication that the protocol analysis device is to present data from the first field and the second field with (a) the graphical indication that the protocol analysis device is to present data from the first field, and (b) a different graphical indication that the protocol analysis device is to present data from the second field.

* * * * *